United States Patent
Zhang et al.

(10) Patent No.: US 11,169,803 B2
(45) Date of Patent: Nov. 9, 2021

(54) COMPUTING DEVICE AND METHOD

(71) Applicant: SHANGHAI CAMBRICON INFORMATION TECHNOLOGY CO., LTD, Shanghai (CN)

(72) Inventors: Yao Zhang, Shanghai (CN); Bingrui Wang, Shanghai (CN)

(73) Assignee: Shanghai Cambricon Information Technology Co., Ltd., Shanghai (CN)

( * ) Notice: Subject to any disclaimer, the term of this patent is extended or adjusted under 35 U.S.C. 154(b) by 143 days.

(21) Appl. No.: 16/714,899

(22) Filed: Dec. 16, 2019

(65) Prior Publication Data
US 2020/0159530 A1 May 21, 2020

Related U.S. Application Data

(63) Continuation of application No. 16/614,215, filed as application No. PCT/CN2018/103850 on Sep. 3, 2018.

(30) Foreign Application Priority Data

Feb. 13, 2018 (CN) .......................... 201810149287.2
Mar. 14, 2018 (CN) .......................... 201810207915.8

(51) Int. Cl.
*G06F 9/30* (2018.01)
*G06F 7/491* (2006.01)
(Continued)

(52) U.S. Cl.
CPC .......... *G06F 9/30025* (2013.01); *G06F 7/491* (2013.01); *G06F 9/3001* (2013.01);
(Continued)

(58) Field of Classification Search
CPC ............. G06F 9/30014; G06F 9/30025; G06F 9/30181; G06F 9/30185
See application file for complete search history.

(56) References Cited

U.S. PATENT DOCUMENTS 7,236,995 B2 * 6/2007 Hinds ................. G06F 9/30025
708/204
7,242,414 B1 * 7/2007 Thekkath ............ G06F 9/30014
345/623
(Continued)

FOREIGN PATENT DOCUMENTS

CN 102981854 A 3/2013
CN 106502626 A 3/2017
(Continued)

OTHER PUBLICATIONS

Vivienne Sze et al: "Efficient Processing of Deep Neural Networks: A Tutorial and Survey", arxiv.org, Cornell University Library, 201 Olin Library Cornell University Ithaca, NY 14853, Mar. 27, 2017 (Mar. 27, 2017), XP080759895, DOI: 10.1109/JPROC.2017.2761740.

(Continued)

*Primary Examiner* — William B Partridge
*Assistant Examiner* — Kasim Alli
(74) *Attorney, Agent, or Firm* — Rimon PC

(57) ABSTRACT

The present disclosure provides a computation device. The computation device is configured to perform a machine learning computation, and includes an operation unit, a controller unit, and a conversion unit. The storage unit is configured to obtain input data and a computation instruction. The controller unit is configured to extract and parse the computation instruction from the storage unit to obtain one or more operation instructions, and to send the one or more operation instructions and the input data to the operation unit. The operation unit is configured to perform operations on the input data according to one or more operation instructions to obtain a computation result of the computation instruction. In the examples of the present disclosure, the input data involved in machine learning computations is (Continued)

represented by fixed-point data, thereby improving the processing speed and efficiency of training operations.

27 Claims, 23 Drawing Sheets

(51) Int. Cl.
```
G06N 20/00      (2019.01)
G06F 16/901     (2019.01)
G06F 13/28      (2006.01)
G06N 3/02       (2006.01)
G06N 3/08       (2006.01)
G06F 9/38       (2018.01)
G06F 12/0871    (2016.01)
G06N 3/063      (2006.01)
G06F 17/16      (2006.01)
```
(52) U.S. Cl.
CPC ...... *G06F 9/30014* (2013.01); *G06F 9/30036* (2013.01); *G06F 9/30181* (2013.01); *G06F 9/3838* (2013.01); *G06F 12/0871* (2013.01); *G06F 13/28* (2013.01); *G06F 16/9027* (2019.01); *G06N 3/02* (2013.01); *G06N 3/08* (2013.01); *G06N 20/00* (2019.01); *G06F 9/30101* (2013.01); *G06F 9/3873* (2013.01); *G06F 9/3877* (2013.01); *G06F 17/16* (2013.01); *G06N 3/063* (2013.01)

(56) References Cited

U.S. PATENT DOCUMENTS

| | | | |
|---|---|---|---|
| 10,224,954 B1 * | 3/2019 | Madduri | H03M 7/40 |
| 2007/0220076 A1 | 9/2007 | Hinds | |
| 2017/0061279 A1 | 3/2017 | Yang et al. | |
| 2018/0157464 A1 * | 6/2018 | Lutz | G06F 9/30036 |

FOREIGN PATENT DOCUMENTS

| | | |
|---|---|---|
| CN | 107451658 A | 12/2017 |
| CN | 107608715 A | 1/2018 |

OTHER PUBLICATIONS

Liu Shaoli et al: "Cambricon: An Instruction Set Architecture for Neural Networks", 2013 21st International Conference on Program Comprehension (ICPC); [International Symposium on Computer Architecture.(ISCA)], IEEE, US, Jun. 18, 2016 (Jun. 18, 2016), pp. 393-405, XP032950675, ISSN: 1063-6897, DOI: 10.1109/ISCA. 2016.42 ISBN: 978-0-7695-3174-8 [retrieved on Aug. 24, 2016].
IBM: "PowerPC Microprocessor Family: Vector/SIMD Multimedia Extension Technology Programming Environments Manual Programming Environments Manual", Aug. 22, 2005 (Aug. 22, 2005), pp. 170-171, XP055673033, Retrieved from the Internet: URL:http:// math-atlas.sourceforge.net/devel/assembly/ vector_simd_pem.ppc. 2005AUG23.pdf [retrieved on Mar. 3, 2020].
Sumod Mohan: "Accuracy and Multi-Core Performance of Machine Learning Algorithms for Handwritten Character Recognition", Aug. 1, 2009 (Aug. 1, 2009), XP055673941, Retrieved from the Internet: URL:https://tigerprints.clemson.edu/cgi/viewcontent.cgi? article= 1634&context=all theses [retrieved on Mar. 5, 2020].
Anonymous: "Control unit—Wikipedia", May 8, 2017 (May 8, 2017), XP055673879,Retrieved from the Internet: URL: https:// web.archive.org/web/20170508110348/https://en.wikipedia.org/ wiki/ Control unit [retrieved on Mar. 5, 2020].
European Patent Office, Extended European Search Report for European Application No. 19212749.6 dated Mar. 18, 2020.
European Patent Office, Extended European Search Report for European Application No. 19212750.4 dated Mar. 18, 2020.
European Patent Office, Extended European Search Report for European Application No. 19212751.2 dated Mar. 18, 2020.
European Patent Office, Extended European Search Report for European Application No. 19212752.0 dated Mar. 18, 2020.
European Patent Office, Extended European Search Report for European Application No. 19214004.4 dated Mar. 18, 2020.
European Patent Office, Extended European Search Report for European Application No. 19213389.0 dated Mar. 18, 2020.
European Patent Office, Extended European Search Report for European Application No. 19212753.8 dated Mar. 18, 2020.
European Patent Office, Extended European Search Report for European Application No. 19212754.6 dated Mar. 18, 2020.
European Patent Office, Extended European Search Report for European Application No. 19212755.3 dated Mar. 18, 2020.
Joel Emer et al: "DNN Accelerator Architectures", CICS/MTL Tutorial, Jan. 1, 2017 (Jan. 1, 2017), XP055672691, Retrieved from the Internet: URL:https://www.rle.mit.edu/eems/wp-content/uploads/ 2017/03/Tutorial-on-DNN-4-of-5-DNN-Accelerator-Architectures. pdf [retrieved on Mar. 2, 2020].
Chen Yu-Hsin et al: "Eyeriss: An Energy-Efficient Reconfigurable Accelerator for Deep Convolutional Neural Networks", IEEE Journal of Solid-State Circuits, IEEE, USA, vol. 52, No. 1, Jan. 1, 2017 (Jan. 1, 2017), pp. 127-138, XP011638633, ISSN: 0018-9200, DOI: 10.1109/JSSC.2016.2616357 [retrieved on Jan. 9, 2017].
European Patent Office, Extended European Search Report for European Application No. 19212756.1 dated Mar. 18, 2020.
European Patent Office, Extended European Search Report for European Application No. 18906652.6 dated Mar. 18, 2020.
European Patent Office, Extended European Search Report for European Application No. 19212746.2 dated Mar. 18, 2020.
Chen, T., et al., "DianNao: A Small-Footprint High-Throughput Accelerator for Ubiquitous Machine-Learning," ASPLOS '14 Proceedings of the 19th international conference on Architectural support for programming languages and operating systems, pp. 269-284, Salt Lake City, Utah, USA—Mar. 1, 2014; available: https://dl.acm.org/citation.cfm?id=2541967.
Chen, T., et al., "A Small-Footprint Accelerator for Large-Scale Neural Networks," ACM Transactions on Computer Systems (TOCS), vol. 33, Issue 2, May 1, 2015, Article No. 6, ACM New York, NY, USA; available: https://dl.acm.org/citation.cfm?id=2701417.
Chen, Y., et al., "DaDianNao: A Machine-Learning Supercomputer," MICRO-47 Proceedings of the 47th Annual IEEE/ACM International Symposium on Microarchitecture, pp. 609-622, Cambridge, United Kingdom—Dec. 13, 2014; available: https://dl.acm. org/citation.cfm?id=2742217.
Luo, T., et al., "DaDianNao: A Neural Network Supercomputer," Published in: IEEE Transactions on Computers, vol. 66 , Issue: 1, pp. 73-88, Date of Publication: May 30, 2016; available: https:// ieeexplore.ieee.org/document/7480791.
Liu, D., et al., "PuDianNao: A Polyvalent Machine Learning Accelerator," ASPLOS '15 Proceedings of the Twentieth International Conference on Architectural Support for Programming Languages and Operating Systems,pp. 369-381, Istanbul, Turkey—Mar. 14, 2015; available: https://dl.acm.org/citation.cfm?id=2694358.
Du, Z., et al., "ShiDianNao: Shifting Vision Processing Closer to the Sensor," ISCA '15 Proceedings of the 42nd Annual International Symposium on Computer Architecture, pp. 92-104, Portland, Oregon—Jun. 13, 2015; available: https://dl.acm.org/citation.cfm?id= 2750389.
Du, Z., et al., "An Accelerator for High Efficient Vision Processing," Published in: IEEE Transactions on Computer-Aided Design of Integrated Circuits and Systems, vol. 36 , Issue: 2, Jun. 22, 2016, pp. 227-240; available: https://ieeexplore.ieee.org/document/7497562.
Liu, S., et al., "Cambricon: An Instruction Set Architecture for Neural Networks," 2016 ACM/IEEE 43rd Annual International Symposium on Computer Architecture (ISCA), Seoul, South Korea, Jun. 18, 2016; available: https://ieeexplore.ieee.org/document/ 7551409.
Zhang, S. et al., "Cambricon-X: An Accelerator for Sparse Neural Networks," Published in: 2016 49th Annual IEEE/ACM International Symposium on Microarchitecture (MICRO), Taipei, Taiwan, Oct. 15, 2016; available: https://ieeexplore.ieee.org/document/ 7783723.

(56) References Cited

OTHER PUBLICATIONS

Chen, Y., et al., "DianNao Family: Energy-Efficient Hardware Accelerators for Machine Learning," Communications of the ACM, vol. 59 Issue 11, Oct. 28, 2016, pp. 105-112, ACM New York, NY, USA; available: https://dl.acm.org/citation.cfm?id=2996864.

* cited by examiner

| Sign bit | 1 | ...... | 1 | 1 |
|---|---|---|---|---|
| | $2^{bitnum-2}$ | | $2^{S+1}$ | $2^S$ |

Figure 2A

COMPUTING DEVICE AND METHOD

RELATED APPLICATIONS

This application is a continuation of U.S. application Ser. No. 16/614,215 filed on Nov. 15, 2019, which is a national stage application of PCT/CN2018/103850 filed Sep. 3, 2018 that claims the benefit of priority from Chinese Application No. 201810207915.8, filed Mar. 14, 2018, and Chinese Application No. 201810149287.2, filed Feb. 13, 2018. The disclosures of the above-mentioned applications are incorporated herein by reference in their entirety.

TECHNICAL FIELD

The present disclosure relates to the field of information processing technology, and specifically relates to a computing device and a computing method.

BACKGROUND

With continuous development and growing demand of information technology, there are increasing challenges in achieving information timeliness. Currently, the speed with which a terminal acquires and processes information is largely determined by how its general purpose processor operates.

In practice, it has been found that how a general purpose processor runs a software program to process information is limited by the processor's operating speed. Generally, when there is a large load to process, general purpose processors are not efficient and are often the causes for delay. For example, in machine learning, when training a learning model, the computation amount of the training operations is so large that it will take an extraordinarily long time for general purpose processors to complete the computations needed to build up the learning model. The low efficiency of general purpose processors in training operations makes them unsuitable for artificial intelligence related tasks.

SUMMARY

A computation device and a computation method are provided according to examples of the present disclosure, which may improve the processing speed of operations and the efficiency.

In a first aspect, there is provided a computation device. The computation device may be configured to perform a machine learning computation, and may include a controller unit, an operation unit, and a conversion unit. The operation unit may include a primary processing circuit and a plurality of secondary processing circuits.

The controller unit may be configured to acquire first input data and a computation instruction, to parse the computation instruction to obtain at least one of a data conversion instruction and at least one operation instruction, where the data conversion instruction may include an opcode field and an opcode. The opcode may be configured to indicate information of a function of the data conversion instruction. The opcode field may include information of a decimal point position, a flag bit indicating a data type of the first input data, and an identifier of data type conversion. The controller unit may be further configured to transfer the opcode and the opcode field of the data conversion instruction and the first input data to the conversion unit, and to send a plurality of operation instructions to the operation unit.

The conversion unit may be configured to convert the first input data into second input data according to the opcode and the opcode field of the data conversion instruction, where the second input data is fixed-point data, and to transfer the second input data to the operation unit.

The operation unit may be configured to perform operations on the second input data according to the plurality of operation instructions to obtain a computation result of the computation instruction.

In an example, the machine learning computation may include an artificial neural network operation. The first input data may include an input neuron and a weight. The computation result is an output neuron.

In an example, the operation unit may include the primary processing circuit and the plurality of secondary processing circuits.

The primary processing circuit may be configured to perform pre-processing on the second input data and to send data and the plurality of operation instructions between the plurality of secondary processing circuits and the primary processing circuit.

The plurality of secondary processing circuits may be configured to perform an intermediate operation to obtain a plurality of intermediate results according to the second input data and the plurality of operation instructions sent from the primary processing circuit, and to transfer the plurality of intermediate results to the primary processing circuit.

The primary processing circuit may be further configured to perform post-processing on the plurality of intermediate results to obtain the computation result of the computation instruction.

In an example, the computation device may further include a storage unit and a direct memory access (DMA) unit;

the storage unit may include any combination of a register and a cache;

the cache may include a scratch pad cache and may be configured to store the first input data; and the register may be configured to store scalar data in the first input data.

In a second aspect, there is provided a method for performing machine learning computations. The method may include the following:

obtaining input data and a computation instruction;

parsing the computation instruction to obtain a data conversion instruction and a plurality of operation instructions, in which the data conversion instruction may include an opcode field and an opcode, where the opcode may be configured to indicate information of a function of the data conversion instruction, and the opcode field may include information of a decimal point position, a flag bit indicating a data type of the first input data, and a data type conversion;

converting the first input data into second input data according to the data conversion instruction, and the second input data is fixed-point data; and performing operations on the second input data according to the plurality of operation instructions to obtain a computation result of the computation instruction.

In a third aspect, a machine learning operation device is provided. The machine learning operation device may include at least one computation device of the first aspect. The at least one computation device may be configured to obtain data to be processed and control information from other processing devices, to perform specified machine learning computations, and to send an execution result to the other processing devices through I/O interfaces.

If the machine learning operation device includes a plurality of the computation devices, the plurality of computation devices may be configured to couple and exchange data with each other through a specific structure.

The plurality of computation devices may be configured to interconnect and to transfer data through a PCIE (peripheral component interface express) bus to support larger-scale machine learning computations, to share the same one control system or have respective control systems, to share the same one memory or have respective memories, and to deploy an interconnection manner of any arbitrary interconnection topology.

In a fourth aspect, a combination processing device is provided. The combination processing device may include the machine learning operation device of the third aspect, universal interconnection interfaces, and other processing devices. The machine learning operation device may be configured to interact with the other processing devices to jointly perform user-specified computing operations. The combination processing device may further include a storage device. The storage device may be configured to couple with the machine learning operation device and the other processing devices for storing data of the machine learning operation device and the other processing devices In a fifth aspect, a neural network chip is provided. The neural network chip may include one of the machine learning operation device of the first aspect, the machine learning operation device of the third aspect, and the combination processing device of the fourth aspect.

In a sixth aspect, a neural network chip package structure is provided. The neural network chip package structure may include the neural network chip of the fifth aspect.

In a seventh aspect, a board is provided. The board may include a storage device, an interface device, a control device, and the neural network chip of the fifth aspect.

The neural network chip is respectively coupled with the storage device, the control device, and the interface device.

The storage device may be configured to store data.

The interface device may be configured to implement data transmission between the neural network chip and external devices.

The control device may be configured to monitor a status of the neural network chip.

Furthermore, the storage device may include a plurality of groups of storage units, each group of the plurality of groups of the storage units is coupled with the neural network chip through a bus, and the storage unit being a double data rate (DDR) synchronous dynamic random access memory (SDRAM).

The neural network chip may include a DDR controller for controlling data transmission and data storage of each of the storage units.

The interface device may include standard PCIE interfaces.

In an eighth aspect, an electronic device is provided. The electronic device may include one of the neural network chip of the fifth aspect, the neural network chip package structure of the sixth aspect, and the board of the seventh aspect.

In examples of the present disclosure, the electronic device may include data processing devices, robots, computers, printers, scanners, tablets, smart terminals, mobile phones, driving recorders, navigators, sensors, cameras, servers, cloud servers, cameras, cameras, projectors, watches, headphones, mobile storage, wearable devices, vehicles, household appliances, and/or medical devices.

The vehicle may include an aircraft, a ship, and/or a car. The household appliance may include a television, an air conditioner, a microwave oven, a refrigerator, a rice cooker, a humidifier, a washing machine, an electric lamp, a gas stove, a range hood. The medical device may include a nuclear magnetic resonance instrument, a B-ultrasound, and/or an electrocardiograph.

In the examples of the present disclosure, the computation device may include an operation unit, a controller unit, and a conversion unit. The controller unit may be configured to extract a computation instruction from a storage unit, and to parse the computation instruction to obtain at least one of a data conversion instruction and at least one operation instruction, and to send the data conversion instruction, at least one operation instruction, and first input data to the operation unit. The operation unit may be configured to convert the first input data into the second input data represented by fixed-point data according to the data conversion instruction, and to perform operations on the second input data according to the at least one operation instruction to obtain a computation result of the computation instruction. In the examples of the present disclosure, the first data involved in machine learning computations is represented by fixed-point data, thereby improving the processing speed and processing efficiency of training operations.

BRIEF DESCRIPTION OF THE DRAWINGS

To describe the technical solutions in the examples of the present disclosure more clearly, the following briefly introduces the accompanying drawings required for describing the examples. Apparently, the accompanying drawings in the following description illustrate some examples of the present disclosure. Those of ordinary skill in the art may also obtain other drawings based on these accompanying drawings without creative efforts.

FIG. 2A is a schematic diagram of yet another data structure of fixed-point data according to an example of the present disclosure;

DETAILED DESCRIPTION OF ILLUSTRATED EXAMPLES

Figure 1:
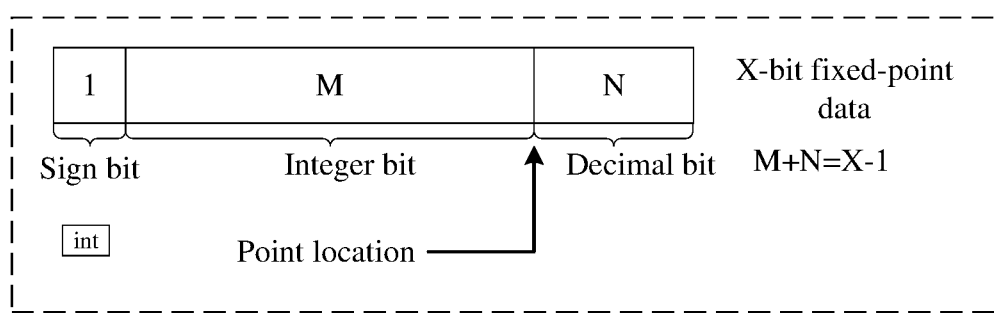
FIG. 1 is a schematic diagram of a data structure of fixed-point data according to an example of the present disclosure.

Technical solutions in the examples of the present disclosure will be described clearly and completely hereinafter with reference to the accompanying drawings in the examples of the present disclosure. Apparently, the described examples are merely some rather than all examples of the present disclosure. All other examples obtained by those of ordinary skill in the art based on the examples of the present disclosure without creative efforts shall fall within the protection scope of the present disclosure.

The terms such as "first", "second", "third", and "fourth" used in the specification, the claims, and the accompanying drawings of the present disclosure are used for distinguishing between different objects rather than describing a particular order. The terms "include" and "comprise" as well as variations thereof are intended to cover non-exclusive inclusion. For example, a process, method, system, product, device, or apparatus including a series of steps or units is not limited to the listed steps or units, it may optionally include other steps or units that are not listed; alternatively, other steps or units inherent to the process, method, product, or device may be included either.

The term "example" or "implementation" referred to herein means that a particular feature, structure, or feature described in conjunction with the example may be contained in at least one example of the present disclosure. The phrase appearing in various places in the specification does not necessarily refer to the same example, nor does it refer to an independent or alternative example that is mutually exclusive with other examples. It is expressly and implicitly understood by those skilled in the art that an example described herein may be combined with other examples.

Examples of the present disclosure provide a data type. The data type may include an adjustment factor. The adjustment factor may be configured to indicate a value range and precision of the data type.

The adjustment factor may include a first scaling factor. Optionally, the adjustment factor may further include a second scaling factor. The first scaling factor may be configured to indicate the precision of the data type, and the second scaling factor may be configured to adjust the value range of the data type.

Optionally, the first scaling factor may be $2^{-m}$, $8^{-m}$, $10^{-m}$, 2, 3, 6, 9, 10, $2^m$, $8^m$, $10^m$, or other values.

In an example, the first scaling factor may be configured to adjust a decimal point position. For example, an input data $INB1=INA1*2^m$ may be obtained by shifting the decimal point position of an input data INA1 expressed in binary to the right by m bits, that is, the input data INB1 is 2m times greater than the input data INA1'. For another example, an input data $INB2=INA2/10^{11}$ may be obtained by shifting the decimal point position of an input data INA2 expressed in decimal to the left by n bits, that is, the input data INB2 is $10^{11}$ times less than the input data INA2, and m and n are integers.

Optionally, the second scaling factor may be 2, 8, 10, 16, or other values.

For example, the value range of the data type corresponding to the input data is $8^{-15}$-$8^{16}$ In the process of performing operations, if an operation result obtained is greater than the maximum value corresponding to the value range of the data type corresponding to the input data, the value range of the data type is multiplied by a second scaling factor (for example, 8) of the data type to obtain a new value range of $8^{-14}$-$8^{17}$. If the operation result obtained is smaller than the minimum value corresponding to the value range of the data type corresponding to the input data, divide the value range of the data type by the second scaling factor (for example, 8) of the data type to obtain a new value range of $8^{-16}$-$8^{15}$.

Scaling factors may be applied to any format of data (such as floating point data and discrete data), so as to adjust the size and precision of the data.

It should be noted that the decimal point position mentioned in the specification of the present disclosure may be adjusted by the above-identified first scaling factor, which will not be described herein.

The structure of fixed-point data is described as follows. FIG. 1 is a schematic diagram of a data structure of the fixed-point data according to an example of the present disclosure. As illustrated in FIG. 1, signed fixed-point data is provided. The signed fixed-point data occupies X bits, which may be referred to as X-bit fixed-point data. The X-bit fixed-point data may include a 1-bit sign bit, an M-bit integer bit, and an N-bit decimal bit, where X−1=M+N. For unsigned fixed-point data, only an integer bit of M bits and a decimal bit of N bits are included, that is, X=M+N.

Compared with a 32-bit floating point data representation, the short-bit fixed-point data representation adopted by the present disclosure occupies fewer bits. In addition, for data of the same layer of the same type in a network model (such as all convolution kernels, input neurons, or offset data of the first convolutional layer), the short-bit fixed-point data representation adopted by the present disclosure may be further provided with a flag bit for recording the decimal point position of the fixed-point data, where the flag bit represents a point location. In this way, the value of the above-mentioned flag bit may be adjusted according to the distribution of the input data, thereby achieving the adjustment of the precision and the representable range of the fixed-point data.

Figure 2:
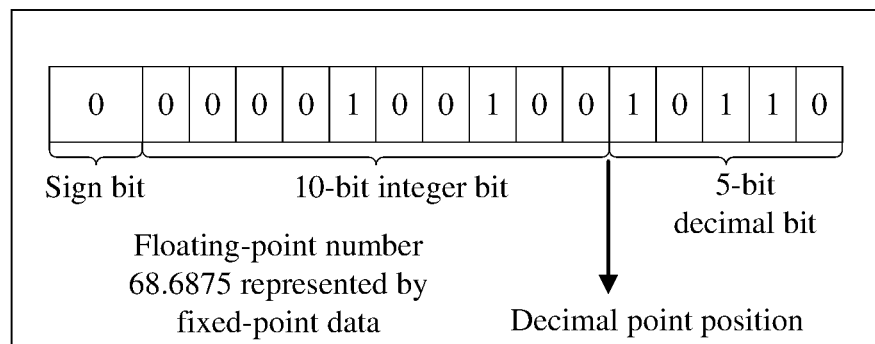
FIG. 2 is a schematic diagram of another data structure of fixed-point data according to an example of the present disclosure.

For example, a floating point number 68.6875 may be converted to signed 16-bit fixed-point data with a decimal point position of five, where the integer part of the floating point number occupies 10 bits, the fractional part of the floating point number occupies 5 bits, and the sign bit of the floating point number occupies 1 bit. As illustrated in FIG. 2, a conversion unit may be configured to convert the above-mentioned floating point number 68.6875 into signed 16-bit fixed-point data of 0000010010010110.

Figure 2A:
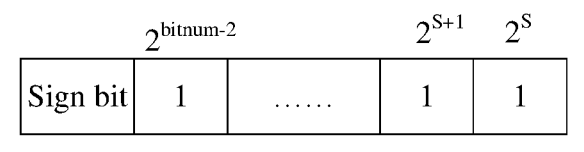

In an example, the above-mentioned fixed-point data may also be represented in the manner illustrated in FIG. 2A. As illustrated in FIG. 2A, "bitnum" represents the bit number occupied by the fixed-point data, "s" represents the decimal point position, and "2s" represents the precision of the fixed-point data. The first bit is a sign bit that indicates the data is positive or negative. For example, if the sign bit is zero, it indicates that the fixed-point data is a positive number; if the sign bit is one, it indicates that the fixed-point data is a negative number. The value of the fixed-point data ranges from "neg" to "pos", where $pos=(2^{bitnum-1}-1)*2^s$, and $neg=-(2^{bitnum-1}-1)*2^s$, wherein the above-mentioned bitnum may be any positive integer. The above-mentioned s may be any integer not less than s_min.

In an example, the above-mentioned bitnum may be 8, 16, 24, 32, 64, or other values. Further, the above-mentioned s_min is −64.

In an example, the above-mentioned bitnum may be 8, 16, 24, 32, 64, or other values. The above-mentioned s may be any integer not less than s_min. Further, the above-mentioned s_min is −64.

Figure 2B:
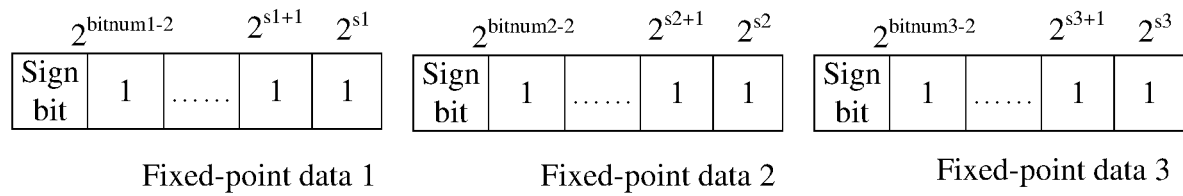
FIG. 2B is a schematic diagram of a still another data structure of fixed-point data according to an example of the present disclosure.

In an example, a plurality of fixed-point representations may be adopted for data having a larger value, as illustrated in FIG. 2B. Referring to FIG. 2B, the data having a larger value is represented by a combination of three kinds of fixed-point data, that is, the fixed-point data may include fixed-point data 1, fixed-point data 2, and fixed-point data 3. The bit width of the fixed-point data 1 is bitnum1, the decimal point position of the fixed-point data 1 is s1; the bit width of the fixed-point data 2 is bitnum2, and the decimal point position of the fixed-point data 2 is s2; the bit width of the fixed-point data 3 is bitnum3, and the decimal point position of the fixed-point data 3 is s3, where bitnum2−2=s1−1, bitnum3−2=s2−1. The range represented by the three fixed-point data is [neg, pos], where $pos=(2^{bitnum-1}-1)*2^s$, $neg=-(2^{bitnum-1}-1)*2^s$.

Figure 3:
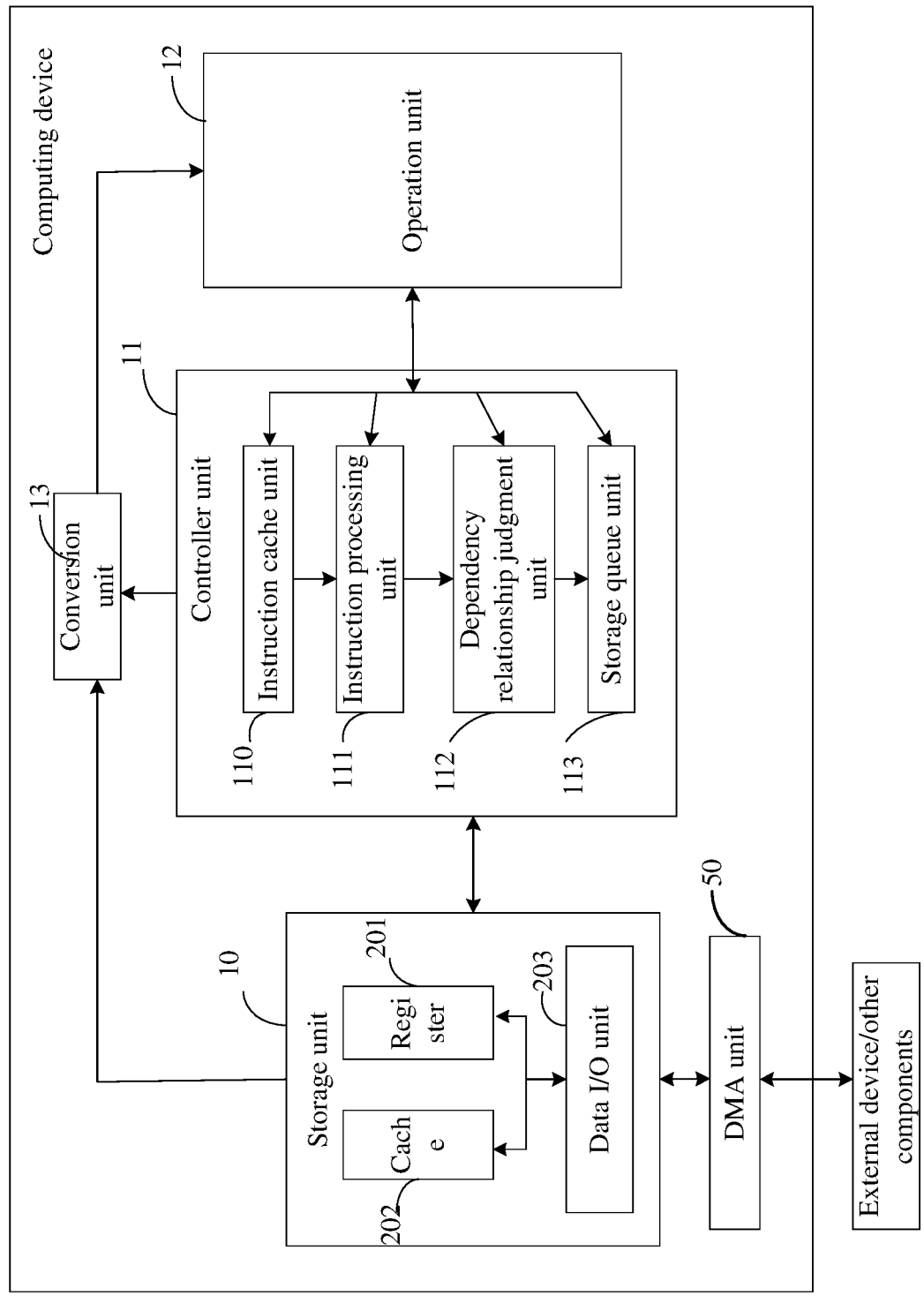
FIG. 3 is a schematic structural diagram of a computation device according to an example of the present disclosure.

First, a computation device adopted in the present disclosure will be introduced. Referring to FIG. 3, the computation device is provided. The computation device may include a controller unit 11, an operation unit 12, and a conversion unit 13, where the controller unit 11 is coupled with the operation unit 12, and the conversion unit 13 is coupled with the controller unit 11 and the operation unit 12.

In an example, a controller unit 11 may be configured to acquire first input data and a computation instruction.

In an example, the first input data may be machine learning data. Further, the machine learning data may include input neurons and weights. Output neurons are final output data or intermediate data.

In an example, the first input data and the computation instruction may be acquired via a data input and output unit. The data input and output unit may specifically include one or more data I/O interfaces or I/O pins.

The above-mentioned computation instruction may include, but is not limited to, a forward operation instruction, a reverse training instruction, other neural network operation instructions (such as a convolution operation instruction), and the like. The examples of the present disclosure do not limit the specific expression of the above-mentioned computation instruction.

The controller unit 11 may be further configured to parse the computation instruction to obtain at least one of a data conversion instruction and at least one operation instruction, where the data conversion instruction may include an opcode field and an opcode. The opcode may be configured to indicate information of a function of the data conversion instruction. The opcode field may include information of a decimal point position, a flag bit indicating a data type of the first input data, and an identifier of data type conversion.

If the opcode field of the data conversion instruction is corresponding to an address of a storage space, the controller unit 11 may be configured to obtain the decimal point position, the flag bit indicating the data type of the first input data, and the identifier of the data type conversion according to the storage space corresponding to the address.

The controller unit 11 may be configured to transfer the opcode and the opcode field of the data conversion instruction and the first input data to a conversion unit 13, and to send multiple operation instructions to an operation unit 12.

The conversion unit 13 may be configured to convert the first input data into second input data according to the opcode and the opcode field of the data conversion instruction, where the second input data is fixed-point data, and to transfer the second input data to the operation unit 12.

The operation unit 12 may be configured to perform operations on the second input data according to the multiple operation instructions to obtain a computation result of the computation instruction.

Figure 3A:
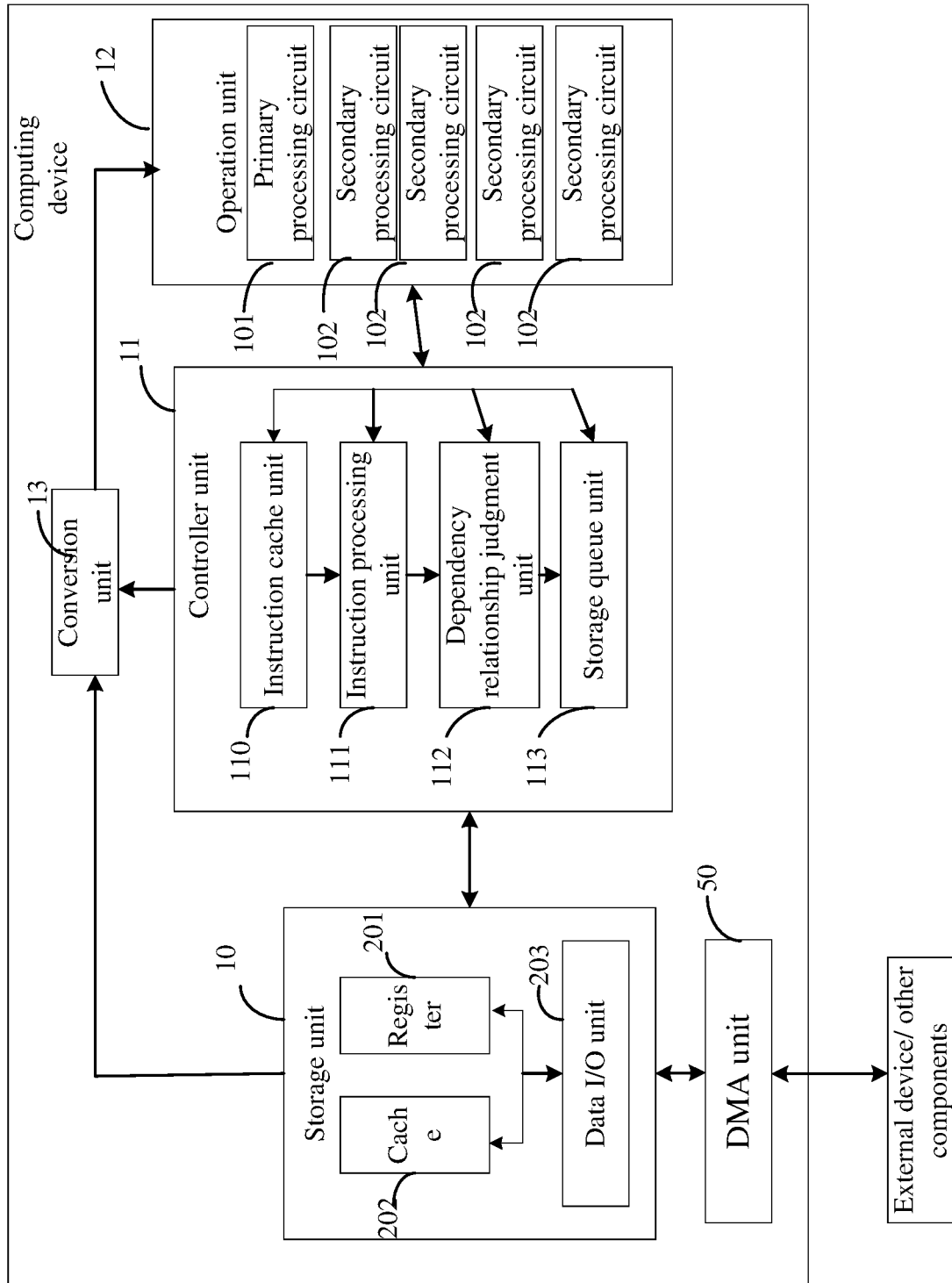
FIG. 3A is a schematic structural diagram of another computation device according to an example of the present disclosure.

In an example, according to the technical solution provided by the present disclosure, the operation unit 12 may be configured as a one-master multi-slave structure. For the forward operation instruction, data may be divided according to the forward operation instruction. In this way, multiple secondary processing circuits 102 may perform parallel operations on data with a large amount of computation, thereby increasing the operation speed, saving computation time, and further reducing power consumption. As illustrated in FIG. 3A, the operation unit 12 may include a primary processing circuit 101 and the multiple secondary processing circuits 102.

The primary processing circuit 101 may be configured to perform pre-processing on the second input data and to send data and the multiple operation instructions between the multiple secondary processing circuits 102 and the primary processing circuit 101.

The multiple secondary processing circuits 102 may be configured to perform intermediate operations to obtain multiple intermediate results according to the second input data and the multiple operation instructions sent from the primary processing circuit 101, and to transfer the multiple intermediate results to the primary processing circuit 101.

The primary processing circuit 101 may be further configured to perform post-processing on the multiple intermediate results to obtain the computation result of the computation instruction.

In an example, the machine learning computations may include deep learning operations (that is, artificial neural network operations). Machine learning data (that is, the first input data) may include input neurons and weights. Output neurons include the computation result or the multiple intermediate results of the computation instruction. The deep learning operations are described as an example, but it should be understood that it is not limited to the deep learning operations.

In an example, the computation device may further include a storage unit 10 and a direct memory access (DMA) unit 50, where the storage unit 10 may include one or any combination of a register and a cache. Specifically, the cache may be configured to store the computation instruction. The register 201 may be configured to store the first input data and scalar data. The first input data may include the input neurons, the weights, and the output neurons.

The cache 202 may be a scratch pad cache.

The DMA unit 50 may be configured to read or store data from the storage unit 10.

In an example, the above-mentioned register 201 may be configured to store the multiple operation instructions, the first input data, the decimal point position, the flag bit indicating the data type of the first input data, and the identifier of data type conversion. The controller unit 11 may be configured to directly acquire the multiple operation instructions, the first input data, the decimal point position, the flag bit indicating the data type of the first input data, and the identifier of the data type conversion from the register 201. The controller unit 11 may be configured to transfer the first input data, the decimal point position, the flag bit indicating the data type of the first input data, and the identifier of the data type conversion to the conversion unit 13, and to send the multiple operation instructions to the operation unit 12.

The conversion unit 13 may be configured to convert the first input data into the second input data according to the decimal point position, the flag bit indicating the data type of the first input data, and the identifier of the data type conversion, and to transfer the second input data to the operation unit 12.

The operation unit 12 may be configured to perform operations on the second input data according to the multiple operation instructions to obtain a computation result.

In an example, the controller unit 11 may include an instruction cache unit 110, an instruction processing unit 111, and a storage queue unit 113.

The instruction cache unit 110 may be configured to store the computation instruction associated with artificial neural network operations.

The instruction processing unit 111 may be configured to parse the computation instruction to obtain the data conversion instruction and the multiple operation instructions, and to parse the data conversion instruction to obtain the opcode and the opcode field of the data conversion instruction.

The storage queue unit 113 may be configured to store an instruction queue, the instruction queue may include the multiple operation instructions or the computation instruction to be executed in a sequence.

For example, in an optional technical solution, the primary processing circuit 101 may also include a control unit, which may include a primary instruction processing unit for decoding instructions into microinstructions. Of course, in another example, the secondary processing circuit 102 may also include another control unit, which may include a secondary instruction processing unit for receiving and processing the microinstructions. The microinstructions may be at a next stage of the instructions, and the microinstruction may be obtained by splitting or decoding the instructions, and may be further decoded into control signals of each component, each unit or each processing circuit.

In an example, the structure of the computation instruction may be shown as in Table 1 below.

TABLE 1

| Opcode | Register or Immediate | Register/Immediate data | ... |
|---|---|---|---|
|  |  |  | ... |

The ellipsis in the above table indicates that multiple registers or immediate data may be included.

In another example of the present disclosure, the computation instruction may include at least one opcode field and one opcode. The computation instruction may include neural network operation instructions. The neural network operation instructions are described as an example, as illustrated in Table 2, where the register number 0, the register number 1, the register number 2, the register number 3, and the register number 4 may be opcode fields. Each of the register number 0, the register number 1, the register number 2, the register number 3, and register number 4 may correspond to one or more registers.

TABLE 2

| Opcode | Register number 0 | Register number 1 | Register number 2 | Register number 3 | Register number 4 |
|---|---|---|---|---|---|
| COM-PUTE | Starting address of the input data | Length of the input data | Starting address of the weight | Length of the weight | Address of activation function interpolation table |
| IO | Address of external data memory | Data length | Address of internal data memory | | |
| NOP | | | | | |
| JUMP | Destination address | | | | |
| MOVE | Input address | Data size | Output address | | |

The above-mentioned registers may be off-chip memories. Of course, in practice, the above-mentioned registers may also be on-chip memories for storing data, and the data may be n-dimensional data, where n is an integer greater than or equal to one. For example, if n=1, the data is a one-dimensional data (that is, a vector). For another example, if n=2, the data is a two-dimensional data (that is, a matrix). If n=3 or more, the data is a multi-dimensional tensor.

In an example, the controller unit 11 may further include a dependency relationship processing unit 112. If the multiple operation instructions are provided, the dependency relationship processing unit 112 may be configured to determine whether there exists an associated relationship between a first operation instruction and a zeroth operation instruction before the first operation instruction, to cache the first operation instruction in the instruction cache unit 110 based on a determination that there exists an associated relationship between the first operation instruction and the zeroth operation instruction, and to extract the first operation instruction from the instruction cache unit 110 to the operation unit, if an execution of the zeroth operation instruction is completed.

The dependency relationship processing unit 112 configured to determine whether there exists an associated relationship between a first operation instruction and a zeroth operation instruction before the first operation instruction may be configured to extract a first storage address interval of data required (such as a matrix) in the first operation instruction according to the first operation instruction, to extract a zeroth storage address interval of matrix required in the zeroth operation instruction according to the zeroth operation instruction, to determine that there exists an associated relationship between the first operation instruction and the zeroth operation instruction, if an overlapped region exists between the first storage address interval and the zeroth storage address interval, and to determine that there does not exist an associated relationship between the first operation instruction and the zeroth operation instruction, if no overlapped region exists between the first storage address interval and the zeroth storage address interval.

Figure 3B:
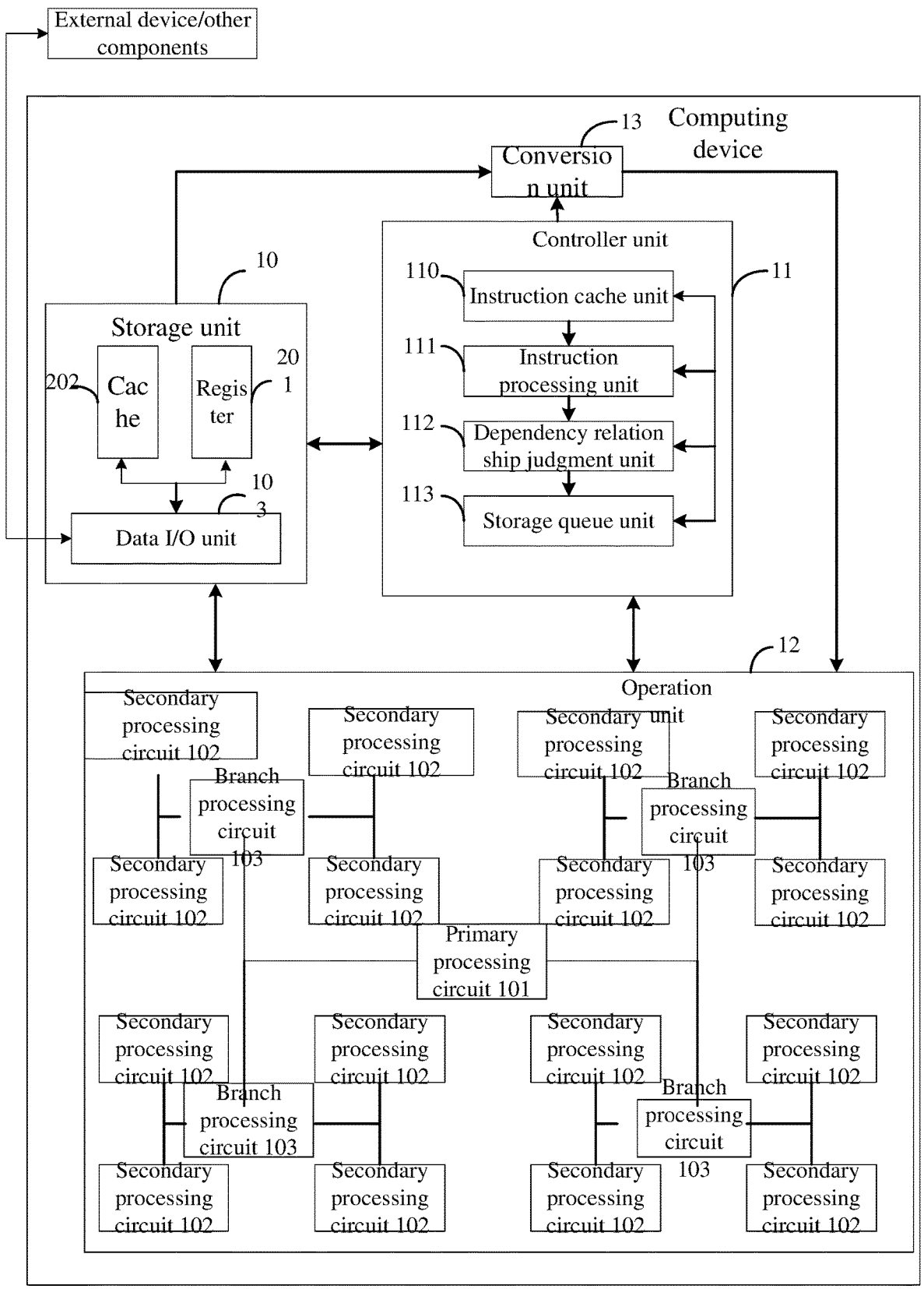
FIG. 3B is a schematic structural diagram of yet another computation device according to an example of the present disclosure.

In an example, as illustrated in FIG. 3B, the operation unit 12 may include a primary processing circuit 101, multiple secondary processing circuits 102, and multiple branch processing circuits 103.

The primary processing circuit 101 may be configured to determine that the input neurons are broadcast data and the weights are distribution data, to divide the distribution data into multiple data blocks, and to send at least one of the multiple data blocks, the broadcast data, and at least one of the multiple operation instructions to the branch processing circuits 103.

The multiple branch processing circuits 103 may be configured to forward the data blocks, the broadcast data, and the multiple operation instructions transferred among the primary processing circuit 101 and the multiple secondary processing circuits 102.

The multiple secondary processing circuits 102 may be configured to perform operations on the data blocks received and the broadcast data received according to the multiple operation instructions to obtain multiple intermediate results, and to transfer the multiple intermediate results to the plurality of branch processing circuits 103.

The primary processing circuit 101 may be further configured to perform post-processing on the multiple intermediate results received from the branch processing circuits 103 to obtain a computation result of the computation instruction, and to send the computation result of the computation instruction to the controller unit 11.

Figure 3C:
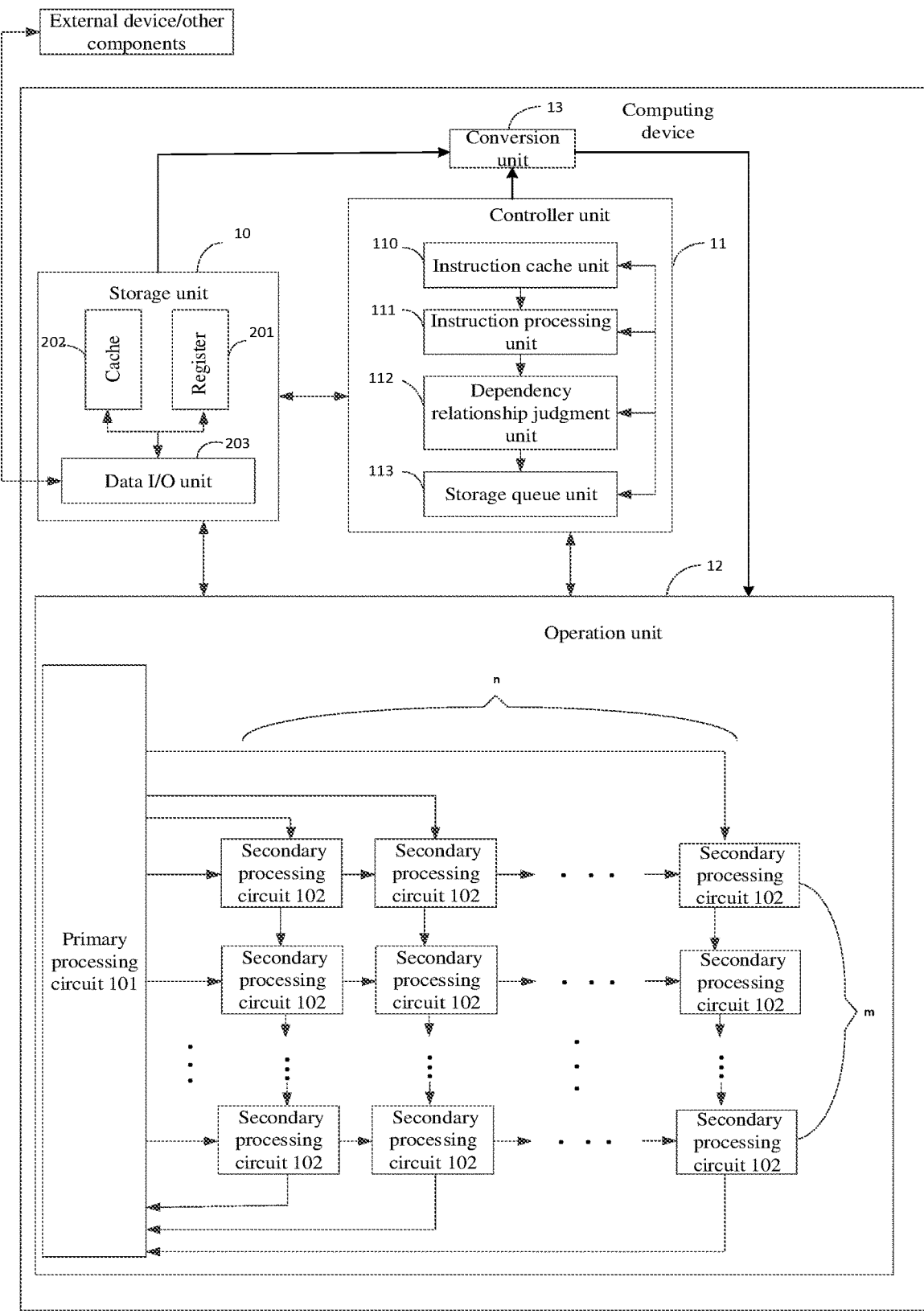
FIG. 3C is a schematic structural diagram of still another computation device according to an example of the present disclosure.

In another example of the present disclosure, as illustrated in FIG. 3C, the operation unit 12 may include a primary processing circuit 101 and multiple secondary processing circuits 102. The multiple secondary processing circuits 102 are distributed in an array. Each secondary processing circuit 102 is coupled with adjacent other secondary processing circuits 102. The primary processing circuit 101 is coupled with K secondary processing circuits 102 of the plurality of secondary processing circuits 102. The K secondary processing circuits 102 may include n secondary processing circuits 102 in the first row, n secondary processing circuits 102 in the $m^{th}$ row, and m secondary processing circuits 102 in the first column. It should be noted that the K secondary processing circuits 102 as illustrated in FIG. 3C include only the n secondary processing circuits 102 in the first row, the n secondary processing circuits 102 in the $m^{th}$ row, and the m secondary processing circuits 102 in the first column. That is, the K secondary processing circuits 102 of the multiple secondary processing circuits 102 are directly coupled with the primary processing circuit 101.

The K secondary processing circuits 102 may be configured to forward data and instructions transferred among the primary processing circuit 101 and the multiple secondary processing circuits 102.

The primary processing circuit 101 may be further configured to determine that the input neurons are broadcast data, the weights are distribution data, to divide the distribution data into multiple data blocks, and to send at least one of the multiple data blocks and at least one of the multiple operation instructions to the K secondary processing circuits 102.

The K secondary processing circuits 102 may be configured to convert the data transferred among the primary processing circuit 101 and the plurality of secondary processing circuits 102.

The multiple secondary processing circuits 102 may be configured to perform operations on the data blocks received according to the multiple operation instructions to obtain multiple intermediate results, and to transfer the multiple intermediate results to the K secondary processing circuits 102.

The primary processing circuit 101 may be configured to process the multiple intermediate results received from the K secondary processing circuits 102 to obtain the computation result of the computation instruction, and to send the computation result of the computation instruction to the controller unit 11.

Figure 3D:
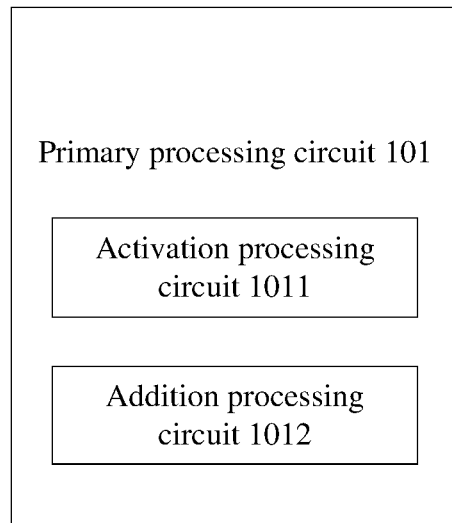
FIG. 3D is a schematic structural diagram of a primary processing circuit according to an example of the present disclosure.

In an example, as illustrated in FIG. 3D, the primary processing circuit 101 illustrated in FIGS. 3A-3C may further include one or any combination of an activation processing circuit 1011 and an addition processing circuit 1012.

The activation processing circuit 1011 may be configured to perform an activation operation on data in the primary processing circuit 101.

The addition processing circuit 1012 may be configured to perform an addition operation or an accumulation operation.

The multiple secondary processing circuits 102 include multiplication processing circuits configured to perform multiplication operations on the data block received to obtain product results. The multiple secondary processing circuits 102 may further include a forwarding processing circuit configured to perform forward processing on the data block received or the product results. The multiple secondary processing circuits 102 may further include accumulation processing circuits configured to perform accumulation operations on the product results to obtain intermediate results.

In an example, the data type of the first input data is inconsistent with an operation type indicated by the multiple operation instructions involved in the operations, and the data type of the second input data is inconsistent with the operation type indicated by the multiple operation instructions involved in the operations. The conversion unit 13 may be configured to obtain the opcode and the opcode field of the data conversion instruction. The opcode may be configured to indicate information of a function of the data conversion instruction. The opcode field may include information of the decimal point position, the flag bit indicating the data type of the first input data, and the identifier of data type conversion. The conversion unit 13 may be configured to convert the first input data into the second input data according to the decimal point position and the identifier of data type conversion.

Specifically, identifiers of data type conversion are in one-to-one correspondence with conversion manners of data type. Table 3 is a table illustrating correspondence relation between the identifier of data type conversion and the conversion manner of data type.

As illustrated in Table 3, if the identifier of data type conversion is 00, the conversion manner of data type is converting the fixed-point data into fixed-point data. If the identifier of data type conversion is 01, the conversion manner of data type is converting the floating point data into floating point data. If the identifier of data type conversion is 10, the conversion manner of data type is converting the fixed-point data into floating point data. If the identifier of data type conversion is 11, the conversion manner of data type is converting the floating point data into fixed-point data.

TABLE 3

| Identifier of data type conversion | Conversion manner of data type |
|---|---|
| 00 | Converting the fixed-point data into fixed-point data |
| 01 | Converting the floating point data into floating point data |
| 10 | Converting the fixed-point data into floating point data |
| 11 | Converting the floating point data into fixed-point data |

Optionally, the correspondence relationship between the identifier of data type conversion and the conversion manner of data type may also be as illustrated in Table 4.

TABLE 4

| Identifier of data type conversion | Conversion manner of data type |
|---|---|
| 0000 | Converting 64-bit fixed-point data into 64-bit floating point data |
| 0001 | Converting 32-bit fixed-point data into 64-bit floating point data |
| 0010 | Converting 16-bit fixed-point data into 64-bit floating point data |
| 0011 | Converting 32-bit fixed-point data into 32-bit floating point data |
| 0100 | Converting 16-bit fixed-point data into 32-bit floating point data |
| 0101 | Converting 16-bit fixed-point data into 16-bit floating point data |
| 0110 | Converting 64-bit floating point data into 64-bit fixed-point data |
| 0111 | Converting 32-bit floating point data into 64-bit fixed-point data |
| 1000 | Converting 16-bit floating point data into 64-bit fixed-point data |
| 1001 | Converting 32-bit floating point data into 32-bit fixed-point data |
| 1010 | Converting 16-bit floating point data into 32-bit fixed-point data |
| 1011 | Converting 16-bit floating point data into 16-bit fixed-point data |

As illustrated in Table 4, if the identifier of data type conversion is 0000, the conversion manner of data type is converting 64-bit fixed-point data into 64-bit floating point data. If the identifier of data type conversion is 0001, the conversion manner of data type is converting 32-bit fixed-point data into 64-bit floating point data. If the identifier of data type conversion is 0010, the conversion manner of data type is converting 16-bit fixed-point data into 64-bit floating point data. If the identifier of data type conversion is 0011, the conversion manner of data type is converting 32-bit fixed-point data into 32-bit floating point data. If the identifier of data type conversion is 0100, the conversion manner of data type is converting 16-bit fixed-point data into 32-bit floating point data. If the identifier of data type conversion is 0101, the conversion manner of data type is converting 16-bit fixed-point data into 16-bit floating point data. If the identifier of data type conversion is 0110, the conversion manner of data type is converting 64-bit floating point data into 64-bit fixed-point data. If the identifier of data type conversion is 0111, the conversion manner of data type is converting 32-bit floating point data into 64-bit fixed-point data. If the identifier of data type conversion is 1000, the conversion manner of data type is converting 16-bit floating point data into 64-bit fixed-point data. If the identifier of data type conversion is 1001, the conversion manner of data type is converting 32-bit floating point data into 32-bit fixed-point data. If the identifier of data type conversion is 1010, the conversion manner of data type is converting 16-bit floating point data into 32-bit fixed-point data. If the identifier of data type conversion is 1011, the conversion manner of data type is converting 16-bit floating point data into 16-bit fixed-point data.

In an example, the controller unit 11 may be configured to acquire a computation instruction from the storage unit 10, and to parse the computation instruction to obtain at least one operation instruction, where the operation instruction may be a variable format operation instruction or a fixed-point format operation instruction.

The variable format operation instruction may include an opcode and an opcode field. The opcode may be configured to indicate a function of the variable format operation instruction. The opcode field may include a first address of first input data, the length of the first input data (optionally), a first address of output data, a decimal point position, a flag bit indicating a data type of the first input data (optionally), and an operation type identifier.

If the above-mentioned operation instruction is the variable format operation instruction, the above-mentioned controller unit 11 parses the above-mentioned variable format operation instruction, so as to obtain the first address of the first input data, the length of the first input data, the first address of the output data, the decimal point position, the flag bit indicating the data type of the first input data, and the operation type identifier. Further, the controller unit 11 obtains the first input data from the storage unit 10 according to the first address of the first input data and the length of the first input data. And then, the controller unit 11 transfers the first input data, the decimal point position, the flag bit indicating the data type of the first input data, and the operation type identifier to the conversion unit 13, and sends the first address of the output data to the operation unit 12.

The conversion unit 13 may be configured to convert the first input data into the second input data according to the flag bit indicating the data type, the decimal point position, and an operation type indicated by the operation type identifier, and to transfer the second input data to the operation unit 12.

The primary processing circuit 101 and the secondary processing circuits 102 of the operation unit 12 may be configured to perform operations on the second input data, so as to obtain the computation result of the computation instruction, and to store the computation result of the computation instruction in a position corresponding to the first address of the output data in the storage unit 10.

The operation type identifier may be configured to indicate a type of data involved in operations if the operation unit 12 performs the operations. The type may include fixed-point data, floating point data, integer data, discrete data, or the like.

In an example, the storage unit 10 may be configured to store the first address of the first input data, the length of the first input data, the first address of the output data, the decimal point position, the flag bit indicating the data type of the first input data, and the operation type identifier. The controller unit 11 may be configured to directly acquire the first address of the first input data, the length of the first input data, the first address of the output data, the decimal point position, the flag bit indicating the data type of the first input data, and the operation type identifier from the storage unit 10. And then, subsequent operations may be performed as the above process.

For example, the above-mentioned operation type identifier may be zero or one. If the flag bit is one, the primary processing circuit 101 and the secondary processing circuits 102 of the operation unit 12 perform floating point operations, that is, the data type of data involved in the floating point operations is floating point type. If the flag bit is zero, the primary processing circuit 101 and the secondary processing circuits 102 of the operation unit 12 perform fixed-point operations, that is, the data type of data involved in the fixed-point operations is fixed-point type.

The operation unit 12 may determine the data type of the input data and the operation type according to the flag bit and the operation type identifier.

Specifically, referring to Table 5. Table 5 is a mapping relationship table of the flag bits and the operation type identifiers.

TABLE 5

| Operation type identifier | Flag bit indicating data type | |
|---|---|---|
| | 0 | 1 |
| 0 | The first input data is fixed-point data, the fixed-point operations are performed | The first input data is floating point data, the floating point operations are performed |
| 1 | The first input data is fixed-point data, converting the fixed-point data into floating point data, the floating point operations are performed | The first input data is floating point data, converting the floating point data into fixed-point data, the fixed-point operations are performed |

As illustrated in Table 5, if the operation type identifier is 0 and the flag bit indicating the data type is 0, the first input data is fixed-point data, and the primary processing circuit 101 and the secondary processing circuits 102 of the operation unit 12 perform fixed-point operations without performing data type conversion. If the operation type identifier is 0 and the flag bit indicating the data type is 1, the first input data is floating point data, and the primary processing circuit 101 and the secondary processing circuits 102 of the operation unit 12 perform floating point operations without performing data type conversion. If the operation type identifier is 1 and the flag bit indicating the data type is 0, the first input data is fixed-point data, and the conversion unit 13 first converts the first input data into the second input data according to the decimal point position, where the second input data is floating point data, the primary processing circuit 101 and the secondary processing circuits 102 of the operation unit 12 perform operations on the second input data. If the operation type identifier is 1 and the flag bit indicating the data type is 1, the first input data is floating point data, and the conversion unit 13 first converts the first input data into the second input data according to the decimal point position, where the second input data is fixed-point data, the primary processing circuit 101 and the secondary processing circuits 102 of the operation unit 12 perform operations on the second input data.

The above-mentioned fixed-point data may include 64-bit fixed-point data, 32-bit fixed-point data, and 16-bit fixed-point data. The above-mentioned floating point data may include 64-bit floating point data, 32-bit floating point data, and 16-bit floating point data. The mapping relationship between the above-mentioned flag bits and the operation type identifiers is illustrated in Table 6.

As illustrated in Table 6, if the operation type identifier is 0000 and the flag bit indicating the data type is 0, the first input data is 64-bit fixed-point data, and the primary processing circuit 101 and the secondary processing circuits 102 of the operation unit 12 perform 64-bit fixed-point operations without performing data type conversion. If the operation type identifier is 0000 and the flag bit indicating the data type is 1, the first input data is 64-bit floating point data, and the primary processing circuit 101 and the secondary processing circuits 102 of the operation unit 12 perform 64-bit floating point operations without performing data type conversion. If the operation type identifier is 0001 and the flag bit indicating the data type is 0, the first input data is 32-bit fixed-point data, and the primary processing circuit 101 and the secondary processing circuits 102 of the operation unit 12 perform 32-bit fixed-point operation without performing data type conversion. If the operation type identifier is 0001 and the flag bit indicating the data type is 1, the first input data is 32-bit floating point data, and the primary processing circuit 101 and the secondary processing circuits 102 of the operation unit 12 perform 32-bit floating point operation without performing data type conversion. If the operation type identifier is 0010 and the flag bit indicating the data type is 0, the first input data is 16-bit fixed-point data, and the primary processing circuit 101 and the secondary processing circuits 102 of the operation unit 12 perform 16-bit fixed-point operation without performing data type conversion. If the operation type identifier is 0010 and the flag bit indicating the data type is 1, the first input data is 16-bit floating point data, and the primary processing circuit 101 and the secondary processing circuits 102 of the operation unit 12 perform 16-bit floating point operation without performing data type conversion.

TABLE 6

| Operation type identifier | Flag bit indicating data type | |
|---|---|---|
| | 0 | 1 |
| 0000 | The first input data is 64-bit fixed-point data and 64-bit fixed-point operations are performed | The first input data is 64-bit floating point data and 64-bit floating point operations are performed |
| 0001 | The first input data is 32-bit fixed-point data and 32-bit fixed-point operations are performed | The first input data is 32-bit floating point data and 32-bit floating point operations are performed |
| 0010 | The first input data is 16-bit fixed-point data and 16-bit fixed-point operations are performed | The first input data is 16-bit floating point data and 16-bit floating point operations are performed |
| 0011 | The first input data is 64-bit fixed-point data, the 64-bit fixed-point data is converted into 64-bit floating point data, and 64-bit floating | The first input data is 64-bit floating point data, the 64-bit floating point data is converted into 64-bit fixed-point data, and 64-bit fixed-point operations are |

TABLE 6-continued

| Operation type identifier | Flag bit indicating data type | |
|---|---|---|
| | 0 | 1 |
| | point operations are performed | performed |
| 0100 | The first input data is 32-bit fixed-point data, the 32-bit fixed-point data is converted into 64-bit floating point data, and 64-bit floating point operations are performed | The first input data is 32-bit floating point data, the 32-bit floating point data is converted into 64-bit fixed-point data, and 64-bit fixed-point operations are performed |
| 0101 | The first input data is 16-bit fixed-point data, the 16-bit fixed-point data is converted into 64-bit floating point data, and 64-bit floating point operations are performed | The first input data is 16-bit floating point data, the 16-bit floating point data is converted into 64-bit fixed-point data, and 64-bit fixed-point operations are performed |
| 0110 | The first input data is 32-bit fixed-point data, the 32-bit fixed-point data is converted into 32-bit floating point data, and 32-bit floating point operations are performed | The first input data is 32-bit floating point data, the 32-bit floating point data is converted into 32-bit fixed-point data, and 32-bit fixed-point operations are performed |
| 0111 | The first input data is 16-bit fixed-point data, the 16-bit fixed-point data is converted into 32-bit floating point data, and 32-bit floating point operations are performed | The first input data is 16-bit floating point data, the 16-bit floating point data is converted into 32-bit fixed-point data, and 32-bit fixed-point operations are performed |
| 1000 | The first input data is 16-bit fixed-point data, the 16-bit fixed-point data is converted into 16-bit floating point data, and 16-bit floating point operations are performed | The first input data is 16-bit floating point data, the 16-bit floating point data is converted into 16-bit fixed-point data, and 16-bit fixed-point operations are performed |
| 1001 | The first input data is 64-bit fixed-point data, the 64-bit fixed-point data is converted into 32-bit floating point data, and 32-bit floating point operations are performed | The first input data is 64-bit floating point data, the 64-bit floating point data is converted into 32-bit fixed-point data, and 32-bit fixed-point operations are performed |
| 1010 | The first input data is 64-bit fixed-point data, the 64-bit fixed-point data is converted into 16-bit floating point data, and 16-bit floating point operations are performed | The first input data is 64-bit floating point data, the 64-bit floating point data is converted into 16-bit fixed-point data, and 16-bit fixed-point operations are performed |
| 1011 | The first input data is 32-bit fixed-point data, the 32-bit fixed-point data is converted into 16-bit floating point data, and 16-bit floating point operations are performed | The first input data is 32-bit floating point data, the 32-bit floating point data is converted into 16-bit fixed-point data, and 16-bit fixed-point operations are performed |

If the operation type identifier is 0011 and the flag bit indicating the data type is 0, the first input data is 64-bit fixed-point data. The conversion unit 13 first converts the first input data into the second input data according to the decimal point position, and the second input data is 64-bit floating point data. And then, the primary processing circuit 101 and the secondary processing circuits 102 of the operation unit 12 perform 64-bit floating point operations on the second input data. If the operation type identifier is 0011 and the flag bit indicating the data type is 1, the first input data is 64-bit floating point data. The conversion unit 13 first converts the first input data into the second input data according to the decimal position, and the second input data is 64-bit fixed-point data. And then, the primary processing circuit 101 and the secondary processing circuits 102 of the operation unit 12 perform 64-bit fixed-point operations on the second input data.

If the operation type identifier is 0100 and the flag bit indicating the data type is 0, the first input data is 32-bit fixed-point data. The conversion unit 13 first converts the first input data into the second input data according to the decimal point position, and the second input data is 64-bit floating point data. And then, the primary processing circuit 101 and the secondary processing circuits 102 of the operation unit 12 perform 64-bit floating point operations on the second input data. If the operation type identifier is 0100 and the flag bit indicating the data type is 1, the first input data is 32-bit floating point data. The conversion unit 13 first converts the first input data into the second input data according to the decimal position, and the second input data is 64-bit fixed-point data. And then, the primary processing circuit 101 and the secondary processing circuits 102 of the operation unit 12 perform 64-bit fixed-point operations on the second input data.

If the operation type identifier is 0101 and the flag bit indicating the data type is 0, the first input data is 16-bit fixed-point data. The conversion unit 13 first converts the first input data into the second input data according to the decimal point position, and the second input data is 64-bit floating point data. And then, the primary processing circuit 101 and the secondary processing circuits 102 of the operation unit 12 perform 64-bit floating point operations on the second input data. If the operation type identifier is 0101 and the flag bit indicating the data type is 1, the first input data is 16-bit floating point data. The conversion unit 13 first converts the first input data into the second input data according to the decimal position, and the second input data is 64-bit fixed-point data. And then, the primary processing circuit 101 and the secondary processing circuits 102 of the operation unit 12 perform 64-bit fixed-point operations on the second input data.

If the operation type identifier is 0110 and the flag bit indicating the data type is 0, the first input data is 32-bit fixed-point data. The conversion unit 13 first converts the first input data into the second input data according to the decimal point position, and the second input data is 32-bit floating point data. And then, the primary processing circuit 101 and the secondary processing circuits 102 of the operation unit 12 perform 32-bit floating point operations on the second input data. If the operation type identifier is 0110 and the flag bit indicating the data type is 1, the first input data is 32-bit floating point data. The conversion unit 13 first converts the first input data into the second input data according to the decimal position, and the second input data is 32-bit fixed-point data. And then, the primary processing circuit 101 and the secondary processing circuits 102 of the operation unit 12 perform 32-bit fixed-point operations on the second input data.

If the operation type identifier is 0111 and the flag bit indicating the data type is 0, the first input data is 16-bit fixed-point data. The conversion unit 13 first converts the first input data into the second input data according to the decimal point position, and the second input data is 32-bit floating point data. And then, the primary processing circuit 101 and the secondary processing circuits 102 of the operation unit 12 perform 32-bit floating point operations on the second input data. If the operation type identifier is 0111 and the flag bit indicating the data type is 1, the first input data is 16-bit floating point data. The conversion unit 13 first converts the first input data into the second input data according to the decimal position, and the second input data is 32-bit fixed-point data. And then, the primary processing circuit 101 and the secondary processing circuits 102 of the operation unit 12 perform 32-bit fixed-point operations on the second input data.

If the operation type identifier is 1000 and the flag bit indicating the data type is 0, the first input data is 16-bit fixed-point data. The conversion unit 13 first converts the first input data into the second input data according to the decimal point position, and the second input data is 16-bit floating point data. And then, the primary processing circuit 101 and the secondary processing circuits 102 of the operation unit 12 perform 16-bit floating point operations on the second input data. If the operation type identifier is 1000 and the flag bit indicating the data type is 1, the first input data is 16-bit floating point data. The conversion unit 13 first converts the first input data into the second input data according to the decimal position, and the second input data is 16-bit fixed-point data. And then, the primary processing circuit 101 and the secondary processing circuits 102 of the operation unit 12 perform 16-bit fixed-point operations on the second input data.

If the operation type identifier is 1001 and the flag bit indicating the data type is 0, the first input data is 64-bit fixed-point data. The conversion unit 13 first converts the first input data into the second input data according to the decimal point position, and the second input data is 32-bit floating point data. And then, the primary processing circuit 101 and the secondary processing circuits 102 of the operation unit 12 perform 32-bit floating point operations on the second input data. If the operation type identifier is 1001 and the flag bit indicating the data type is 1, the first input data is 64-bit floating point data. The conversion unit 13 first converts the first input data into the second input data according to the decimal position, and the second input data is 32-bit fixed-point data. And then, the primary processing circuit 101 and the secondary processing circuits 102 of the operation unit 12 perform 32-bit fixed-point operations on the second input data.

If the operation type identifier is 1010 and the flag bit indicating the data type is 0, the first input data is 64-bit fixed-point data. The conversion unit 13 first converts the first input data into the second input data according to the decimal point position, and the second input data is 16-bit floating point data. And then, the primary processing circuit 101 and the secondary processing circuits 102 of the operation unit 12 perform 16-bit floating point operations on the second input data. If the operation type identifier is 1010 and the flag bit indicating the data type is 1, the first input data is 64-bit floating point data. The conversion unit 13 first converts the first input data into the second input data according to the decimal position, and the second input data is 16-bit fixed-point data. And then, the primary processing circuit 101 and the secondary processing circuits 102 of the operation unit 12 perform 16-bit fixed-point operations on the second input data.

If the operation type identifier is 1011 and the flag bit indicating the data type is 0, the first input data is 32-bit fixed-point data. The conversion unit 13 first converts the first input data into the second input data according to the decimal point position, and the second input data is 16-bit floating point data. And then, the primary processing circuit 101 and the secondary processing circuits 102 of the operation unit 12 perform 16-bit floating point operations on the second input data. If the operation type identifier is 1011 and the flag bit indicating the data type is 1, the first input data is 32-bit floating point data. The conversion unit 13 first converts the first input data into the second input data according to the decimal position, and the second input data is 16-bit fixed-point data. And then, the primary processing circuit 101 and the secondary processing circuits 102 of the operation unit 12 perform 16-bit fixed-point operations on the second input data.

In an example, above-mentioned operation instruction may be a fixed-point format operation instruction, and the fixed-point format operation instruction may include an opcode field and an opcode. The opcode may be configured to indicate a function of the fixed-point format operation instruction. The opcode field may include a first address of the first input data, the length of the first input data (optionally), a first address of output data, and a decimal point position.

If the above-mentioned controller unit 11 has obtained the above-mentioned fixed-point format operation instruction, the controller unit 11 parses the fixed-point format operation instruction, so as to obtain the first address of the first input data, the length of the first input data, the first address of the output data, and the decimal point position. Further, the controller unit 11 obtains the first input data from the storage unit 10 according to the first address of the first input data and the length of the first input data. And then, the controller unit 11 sends the first input data and the decimal point position to the conversion unit 13, and sends the first address of the output data to the operation unit 12. The conversion unit 13 may be configured to convert the first input data into the second input data according to the decimal point position, and to transfer the second input data to the operation unit 12. The primary processing circuit 101 and the secondary processing circuits 102 of the operation unit 12 may be configured to perform operations on the second input data, so as to obtain the computation result of the computation instruction, and to store the computation result of the computation instruction in a position corresponding to the first address of the output data in the storage unit 10.

In an example, before the operation unit 12 of the computation device performs operations on data of an $i^{th}$ layer of a multi-layer neural network model, the controller unit 11 of the computation device acquires a configuration command, which may include a decimal point position and a data type of data involved in the operations. The controller unit 11 parses the configuration instruction to obtain the decimal point position and the data type of the data involved in the operations. Alternatively, the controller unit 11 directly acquires the above-mentioned decimal point position and the data type of the data involved in the operations from the storage unit 10. If the controller unit 11 has obtained the input data, it is determined whether the data type of the input data is consistent with that of the data involved in the operations. If it is determined that the data type of the input data is inconsistent with that of the data involved in the operations, the controller unit 11 sends the input data, the decimal point position, and the data type of the data involved in the operations to the conversion unit 13. The conversion unit 13 performs data type conversion on the input data according to the decimal point position and the data type of the data involved in the operations, such that the data type of the input data is consistent with that of the data involved in the operations. And then, the input data converted is transferred to the operation unit 12, and the primary processing circuit 101 and the secondary processing circuits 102 of the operation unit 12 perform operations on the input data converted. If it is determined that the data type of the input data is consistent with that of the data involved in the operations, the controller unit 11 transfers the input data to the operation unit 12, and the primary processing circuit 101 and the secondary processing circuits 102 of the operation unit 12 directly perform operations on the input data without performing data type conversion.

In an example, if the input data is fixed-point data and the data type of the data involved in the operations is fixed-point data, the controller unit 11 further determines whether the decimal point position of the input data is consistent with the decimal point position of the data involved in the operations. If the decimal point position of the input data is inconsistent with the decimal point position of the data involved in the operations, the controller unit 11 transfers the input data, the decimal point position of the input data, and the decimal point position of the data involved in the operations to the conversion unit 13. The conversion unit 13 converts the input data into fixed-point data, and a decimal point position of the fixed-point data is consistent with the decimal point position of the data involved in the operations. And then, the input data converted is transferred to the operation unit 12, and the primary processing circuit 101 and the secondary processing circuits 102 of the operation unit 12 perform operations on the input data converted.

In other words, the above-mentioned operation instruction may be replaced with the above-mentioned configuration instruction.

In another example of the present disclosure, the operation instruction may be an instruction of matrix multiplying matrix, an accumulation instruction, an activation instruction, and the like.

Figure 3E:
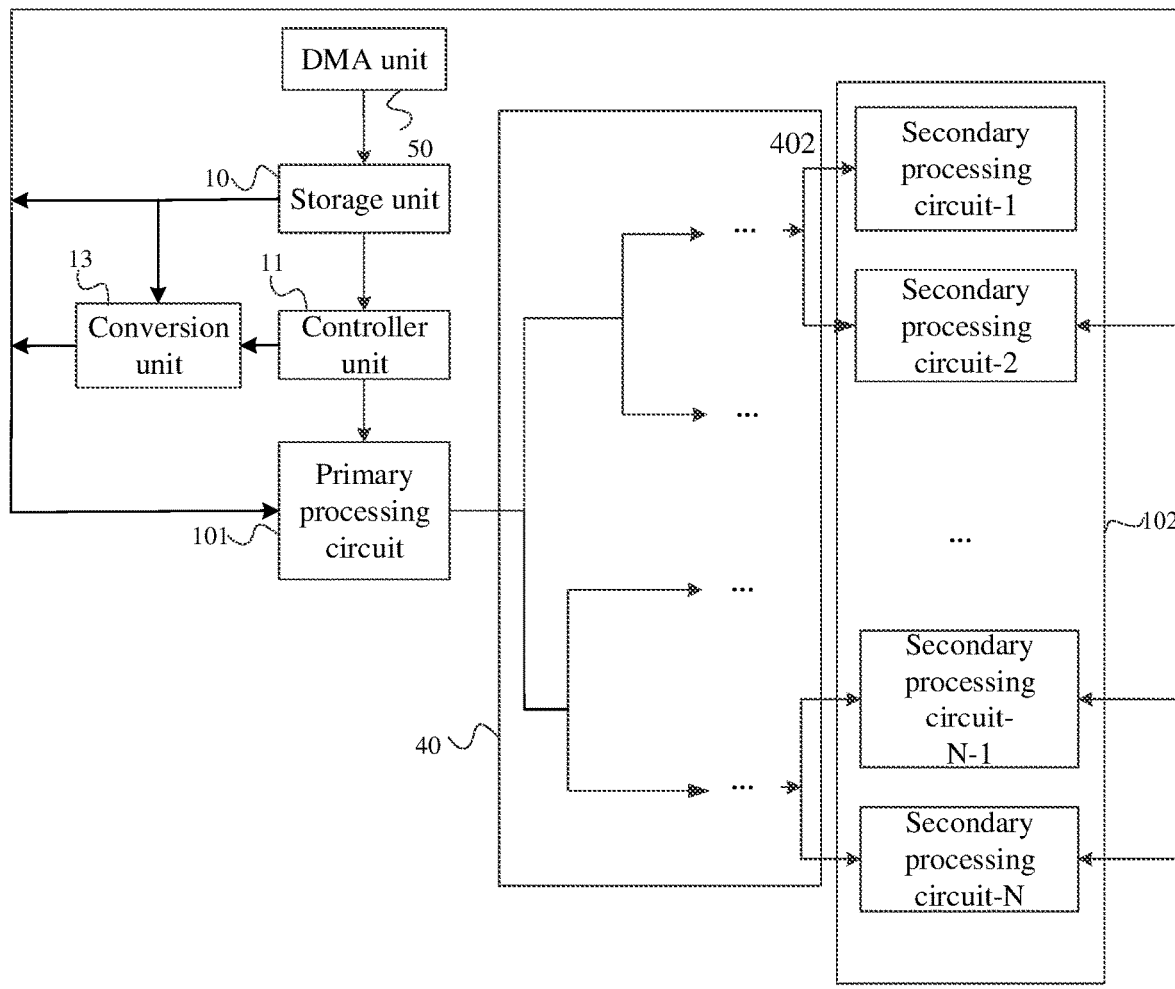
FIG. 3E is a schematic structural diagram of still another computation device according to an example of the present disclosure.

In an example, as illustrated in FIG. 3E, the operation unit may include a tree module 40. The tree module 40 may include a root port 401 coupled with the primary processing circuit 101 and multiple branch ports 402. Each of the multiple branch ports 402 is respectively coupled with one of the multiple secondary processing circuits 102.

Figure 6:
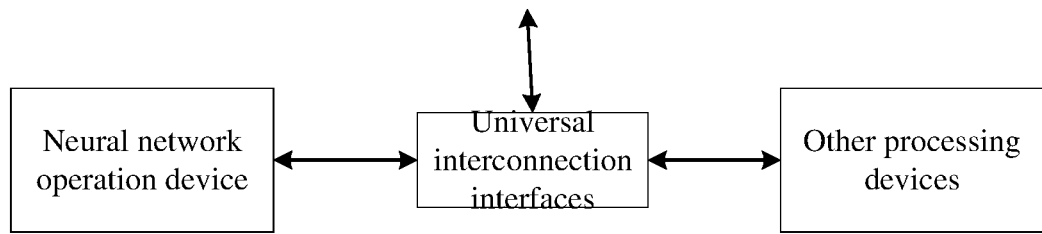
FIG. 6 is a structural diagram of a combined processing device according to an example of the present disclosure.
Figure 6A:
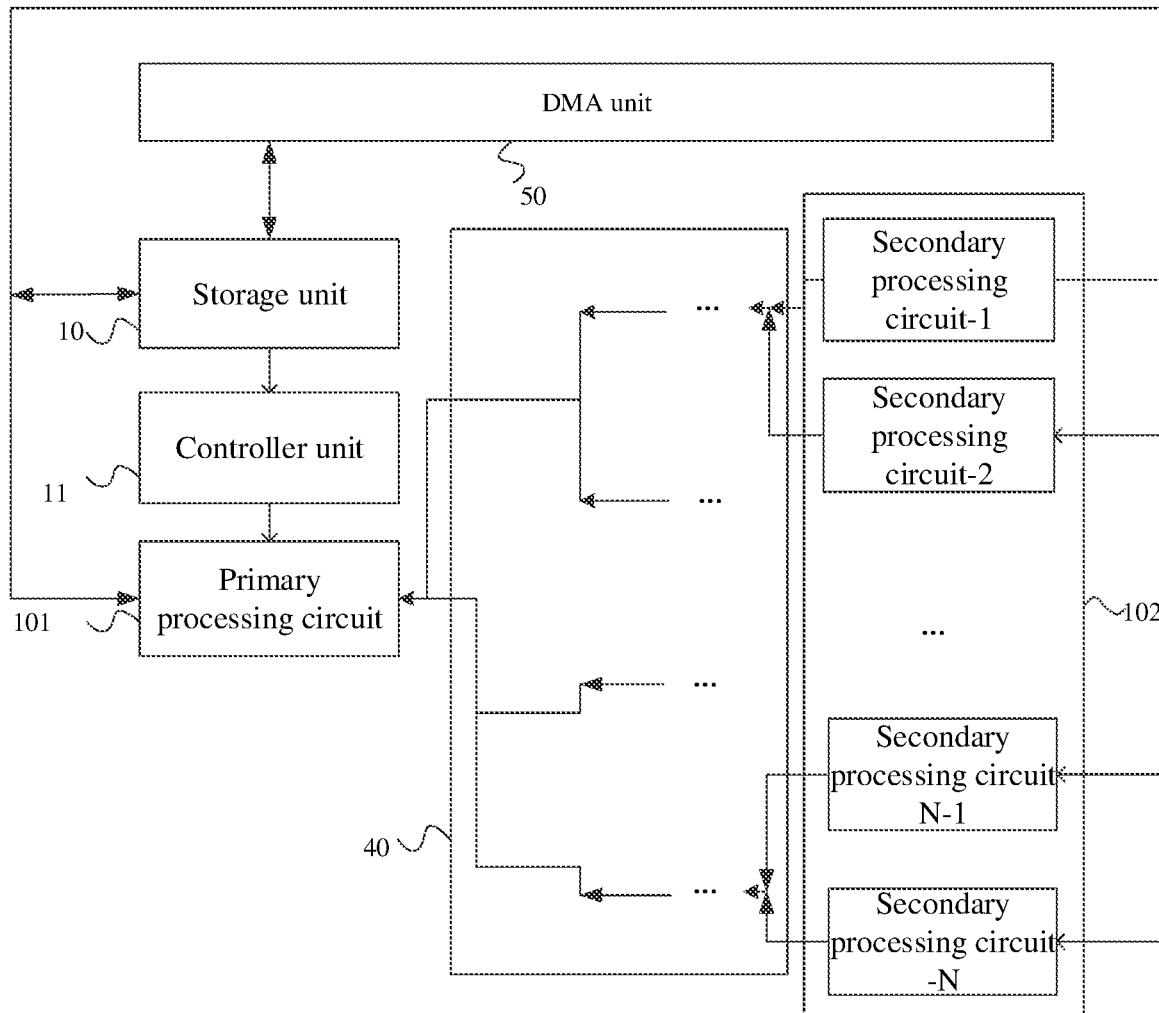
FIG. 6A is a schematic structural diagram of still yet another computation device according to an example of the present disclosure.

The tree module 40 may have a transceiving function. As illustrated in FIG. 3E, the tree module 40 may have a transferring function. As illustrated in FIG. 6A, the tree module 40 may have a receiving function.

The tree module may be configured to forward data and the multiple operation instructions exchanged among the primary processing circuit 101 and the multiple secondary processing circuits 102.

The tree module 40 may be configured to forward data blocks, weights, and operation instructions exchanged among the primary processing circuit 101 and the multiple secondary processing circuits 102.

In an example, the tree module 40 is an operation module of the computation device, and may include at least one layer of nodes. Each node is a line structure with a forwarding function and may not have a computing function. If the tree module 40 has a zero layer of nodes, the tree module 40 may not be needed for the computation device.

Figure 3F:
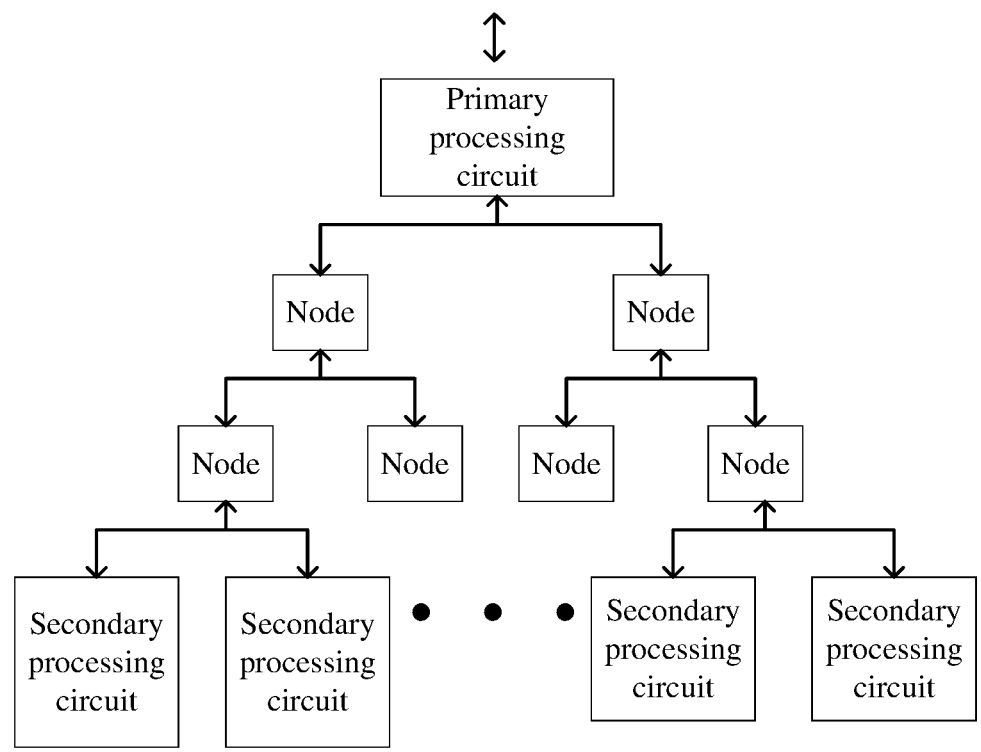
FIG. 3F is a schematic structural diagram of a tree module according to an example of the present disclosure.

In an example, the tree module 40 may be an n-tree structure, for example, a binary tree structure as illustrated in FIG. 3F, and may also be a tri-tree structure. The n may be an integer greater than or equal to two. The examples of the present disclosure do not limit the specific value of the foregoing n. The number of layers may be two, and the secondary processing circuit 102 may be coupled with nodes other than nodes of the second last layer. For example, the secondary processing circuit 102 may be coupled with nodes of the first last layer illustrated in FIG. 3F.

Figure 3G:
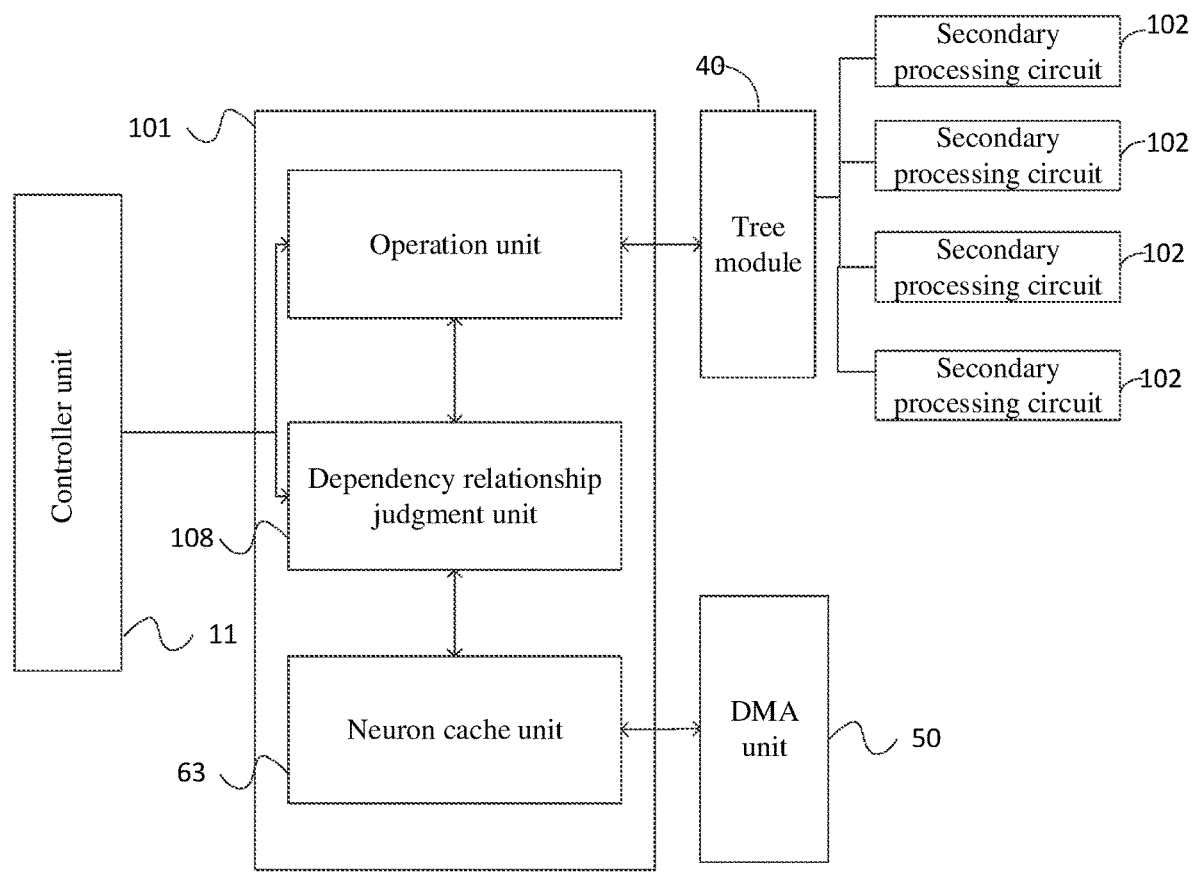
FIG. 3G is a schematic structural diagram of still another computation device according to an example of the present disclosure.

In an example, the operation unit 12 may be provided with a separate cache. As illustrated in FIG. 3G, the operation unit 12 may include a neuron cache unit 63 configured to buffer input neuron vector data and output neuron weight data of the secondary processing circuits 102.

Figure 3H:
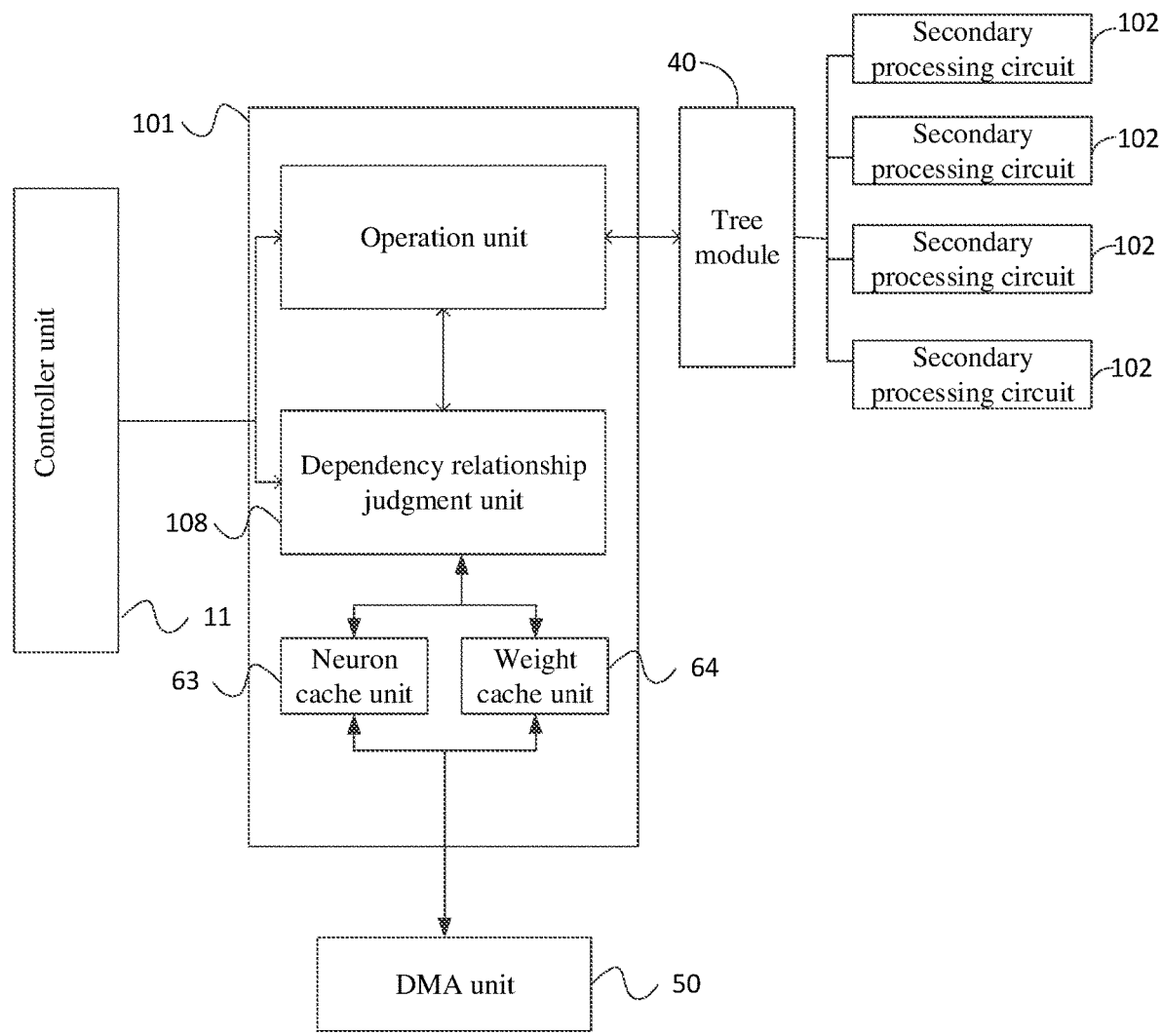
FIG. 3H is a schematic structural diagram of still another computation device according to an example of the present disclosure.

As illustrated in FIG. 3H, the operation unit 12 may further include a weight cache unit 64 configured to buffer weight data required by the secondary processing circuit 102 in the operation process.

In an example, fully coupled operations in neural network operations are described as an example, and the operation process may be expressed as $y=f(wx+b)$, where x is an input neuron matrix, w is a weight matrix, b is an offset scalar, and f is an activation function. The activation function f may be one of sigmoid function, tan h function, relu function, and softmax function. In this example, assuming a binary tree structure with 8 secondary processing circuits 102 is provided, which may be implemented as follows:

obtaining, by the controller unit 11, the input neuron matrix x, the weight matrix w, and a fully coupled operation instruction from the storage unit 10, and sending the input neuron matrix x, the weight matrix w, and the fully coupled operation instruction to the primary processing circuit 101;

dividing, by the primary processing circuit 101, the input neuron matrix x into eight sub-matrices, distributing the eight sub-matrices through the tree module to the eight secondary processing circuits 102, and broadcasting the weight matrix w to the eight secondary processing circuits 102; and performing, by the plurality of secondary processing circuits 102, multiplication and accumulation operations of the eight sub-matrices and the weight matrix w in parallel to obtain eight intermediate results, and sending the eight intermediate results to the primary processing circuit 101.

The primary processing circuit 101 may be configured to rank eight internal results to obtain an operation result, to perform an offset operation with the offset b on the operation result, and to perform an activation operation to obtain a final result y. The final result y is sent to the controller unit 11, and the controller unit 11 may be configured to output or store the final result y into the storage unit 10.

In an example, the operation unit 12 may include, but not limited to, one or more multipliers of a first part, one or more adders of a second part (more specifically, the adders of the second part may also constitute an addition tree), an activation function unit of a third part, and/or a vector processing unit of the fourth part. More specifically, the vector processing unit may process vector operations and/or pooling operations. In the first part, input data 1 (i.e., in1) multiplies input data 2 (i.e., in2) to obtain output data (i.e., out), the operations in the first part may be represented by out=in1*in2. In the second part, an addition operation is performed on the input data (in1) via the adder(s) to obtain the out data (out). More specifically, if the second part is an addition tree, an addition operation is performed step by step on the input data (in1) through the addition tree to obtain the output data (out). The in1 is a vector of length N, and N is greater than one, the operations in the second part may be represented by out=in1[1]+in1[2]+ . . . +in1[N], and/or the input data (in1) is added step by step via the adder, and then added to the input data (in2) to obtain the output data (out), that is, out=in1[1]+in1[2]+ . . . +in1[N]+in2. Alternatively, the input data (in1) and the input data (in2) is added to obtain the output data (out), that is, out=in1+in2. In the third part, operations of an activation function (active) may be performed on input data (in) to obtain an activation output data (out), and the operations in the third part may be represented by out=active(in). The activation function (active) may be one of functions sigmoid, tan h, relu, softmax, etc. In addition to the activation operation, the third part may implement other nonlinear functions. The input data (in) may be used to obtain the output data (out) via an operation function (f), that is, out=f (in). The vector processing unit may be configured to perform the pooling operation on the input data (in) to obtain the output data (out), that is, out=pool(in), where the function pool is a pooling operation. The pooling operation may include, but not limited to, average pooling, maximum pooling, median pooling. The input data is data in a pooled core associated with output out.

The operation unit 12 may be configured to perform operations, which may include at least one of operations in the first part, operations in the second part, operations in the third part, and operations in the fourth part. The operations in the first part may include multiplying the input data 1 and the input data 2 to obtain the output data. In the operations in the second part, an addition operation is performed (more specifically, the addition operation is an addition tree operation, and with the addition operation, the input data 1 is added step by step via the addition tree), or the input data 1 is added with the input data 2 to obtain the out data. In the third part, operations of the activation function (active) may be performed on the input data to obtain the output data. In the fourth part, the pooling operation may be performed, that is, out=pool (in), and the function pool is a pooling operation. The pooling operation may include, but is not limited to, average pooling, maximum pooling, median pooling. The input data is data in a pooled core associated with output out. The operations of the above-identified parts may be freely selected by combining multiple parts in different sequences to achieve various functions. Accordingly, the operation unit 12 may include a secondary, tertiary, or quaternary flow-level architecture.

It should be noted that the first input data is long-digit non-fixed-point data, for example, 32-bit floating point data, and may be standard 64-bit or 16-bit floating point data, etc. In this example of the present disclosure, only 32-bit data is described as an example. The second input data is short-digit fixed-point data, which is also referred to as a small-digit fixed-point data, and represents fixed-point data represented by a smaller number of bits than the first input data of the long-digit non-fixed-point data.

In an example, the first input data is non-fixed-point data, and the second input data is fixed-point data, and a bit number occupied by the first input data is greater than or equal to that occupied by the second input data. For example, the first input data is 32-bit floating point data, and the second input data is 32-bit fixed-point data. For another example, the first input data is 32-bit floating point data, and the second input data is 16-bit fixed-point data.

Specifically, for different layers of different network models, the above-mentioned first input data may include different types of data. The decimal point positions of the different types of data are different, that is, the accuracy of corresponding fixed-point data is different from that of other data. For a fully coupled layer, the first input data may include data such as input neurons, weights, and offset data. For a convolution layer, the first input data may include data such as convolution kernels, input neurons, and offset data.

For example, for a fully coupled layer, the above-mentioned decimal point position may include a decimal point position of the input neuron, a decimal point position of the weight, and a decimal point position of the offset data. It should be noted that the decimal point position of the input neuron, the decimal point position of the weight, and the decimal point position of the offset data may all be the same or partially the same or different from each other.

In an example, the controller unit 11 may be further configured to determine a decimal point position of the first input data and a bit width of the fixed-point data prior to acquiring the first input data and the computation instruction. The bit width of fixed-point data is a bit width of the first input data converted into fixed-point data.

The operation unit 12 may be further configured to initialize a decimal point position of the first input data and adjust a decimal point position of the first input data.

The bit width of fixed-point data of the first input data is bits occupied by the first input data represented by fixed-point data. The above-mentioned decimal point position is bits occupied by a fractional part of the first data represented by fixed-point data. The decimal point position may be configured to indicate the accuracy of the fixed-point data. Referring to the related description of FIG. 2A for details.

In an example, the first input data may be any type of data, and first input data a is converted into the second input data a according to the decimal point position and the bit width of the fixed-point data, which is described as follows.

$$\hat{a} = \begin{cases} \lceil a/2^s \rceil * 2^s, & neg \leq a \leq pos \\ pos, & a > pos \\ neg, & a < neg \end{cases}$$

If the first input data a satisfies a condition of neg≤a≤pos the second input data â is represented as |a/2$^s$|*2$^s$. If the first input data a is greater than pos, the second input data â is represented as pos. If the first input data a is less than neg, the second input data â is represented as neg.

In an example, input neurons, weights, output neurons, input neuron derivatives, output neuron derivatives, and weight derivatives of a convolutional layer and a fully coupled layer are represented by fixed-point data.

In an example, the bit width of fixed-point data of the input neuron may be 8, 16, 32, 64, or other bits. Specifically, the bit width of fixed-point data of the input neuron is 8.

In an example, the bit width of fixed-point data of the weight may be 8, 16, 32, 64, or other bits. Specifically, the bit width of the fixed-point data of the weight is 8.

In an example, the bit width of fixed-point data of the input neuron derivative may be 8, 16, 32, 64, or other bits. Specifically, the bit width of fixed-point data of the input neuron derivative is 16.

In an example, the bit width of fixed-point data of the output neuron derivative may be 8, 16, 32, 64, or other bits. Specifically, the bit width of fixed-point data of the output neuron derivative is 24 bits.

In an example, the bit width of fixed-point data of the weight derivative may be 8, 16, 32, 64, or other bits. Specifically, the bit width of fixed-point data of the weight derivative is 24 bits.

In an example, the data a with a large value in data involved in a multi-layer network model operation may adopt multiple representation manners of fixed-point data. Referring to the related description of FIG. 2B for details.

In an example, the first input data may be any type of data, and the first input data a is converted into the second input data a according to the decimal point position and the bit width of fixed-point data, which is described as follows.

$$\hat{a} = \begin{cases} \sum_{i}^{n} \hat{a}_i, & neg \le a \le pos \\ pos, & a > pos \\ neg, & a < neg \end{cases}$$

If the first input data a satisfies a condition of neg≤a≤pos, the second input data â is represented as $$\hat{a}_i = \left\lceil \frac{a - a_i - 1}{2^{si}} \right\rceil * 2^{si},$$

where $\hat{a}_0=0$. If the first input data a is greater than pos, the second input data â is represented as pos. If the first input data a is less than neg, the second input data â is represented as neg.

Further, the operation unit 12 may be configured to initialize the decimal point position of the first input data as follows:

initializing the decimal point position of the first input data according to a maximum absolute value of the first input data; or initializing the decimal point position of the first input data according to a minimum absolute value of the first input data; or initializing the decimal point position of the first input data according to a relationship between different data types in the first input data; or initializing the decimal point position of the first input data according to an empirical value constant.

Specifically, the above decimal point position s need to be initialized and dynamically adjusted according to data of different categories, data of different neural network layers, and data of different iteration rounds.

An initialization process of the decimal point position of the first input data is specifically described as follows, for example, the decimal point position adopted by the fixed-point data is determined when converting the first input data at the first time.

The operation unit 1211 may be configured to initialize the decimal point position s of the first input data as follows:

initializing the decimal point position s of the first input data according to the maximum absolute value of the first input data; initializing the decimal point position s of the first input data according to the minimum absolute value of the first input data; initializing the decimal point position s of the first input data according to relationship between different data types in the first input data; and initializing the decimal point position s of the first input data according to the empirical value constant.

Specifically, the above-mentioned initialization process is specifically described as follows.

At step (a), the operation unit 12 may be configured to initialize the decimal point position s of the first input data according to the maximum absolute value of the first input data.

The above-mentioned operation unit 12 specifically initializes the decimal point positions of the first input data by performing an operation shown by the following formula.

$$s_a = \lceil \log_2 a_{max} - bitnum + 1 \rceil$$

The $a_{max}$ represents the maximum absolute value of the first input data. The bitnum represents the bit width of the fixed-point data converted from the first input data. The $s_a$ represents the decimal point position of the first input data.

According to categories and network levels, the data involved in operations may be divided into the input neuron $X^{(l)}$, the output neuron $Y^{(l)}$, the weight $W^{(l)}$, the input neuron derivative $\nabla_X^{(l)}$, the output neuron derivative $\nabla_Y^{(l)}$, and the weight derivative $\nabla_W^{(l)}$ of the l-th layer. The maximum absolute value may be searched by one of manners including searching by data category, searching by layer and data category, searching by layer, data category, and group. The maximum absolute value of the first input data may be determined as follows.

At step (a.1), the operation unit 12 may be configured to search the maximum absolute value by data category.

Specifically, the first input data may include each element $a_i^{(l)}$ in a vector/matrix, where element $a^{(l)}$ may be an input neuron $X^{(l)}$, an output neuron $Y^{(l)}$, a weight $W^{(l)}$, an input neuron derivative $\nabla_X^{(l)}$, an output neuron derivative $\nabla_Y^{(l)}$, or a weight derivative $\nabla_W^{(l)}$. In other words, the above-mentioned first input data may include input neurons, weights, output neurons, input neuron derivatives, weight derivatives, and output neuron derivatives. The above-mentioned decimal point position of the first input data may include a decimal point position of the input neuron, a decimal point position of the weight, a decimal point position of the output neuron, a decimal point position of the input neuron derivative, a decimal point position of the weight derivative, and a decimal point position of the neuron derivative. The input neurons, the weights, the output neurons, the input neuron derivatives, the weight derivatives, and the output neuron derivatives are all represented in a matrix or vector form. The operation unit 12 may be configured to acquire the maximum absolute value (that is, $$a_{max} = \max_{i,l}(abs(a_i^{(l)}))$$

of each category data by traversing all elements in the vector/matrix of each layer of the above-mentioned multi-layer network model. The decimal point position $s_a$ of the fixed-point data converted from the input data a of each category data is determined by a formula of $s_a = \lceil \log_2 a_{max} - bitnum + 1 \rceil$.

At step (a.2), the operation unit 12 may be configured to search the maximum absolute value by layer and data category.

Specifically, the first input data may include each element $a_i^{(l)}$ in a vector/matrix, where $a^{(l)}$ may be input neurons $X^{(l)}$, output neurons $Y^{(l)}$, weights $W^{(l)}$, an input neuron derivative $\nabla_X^{(l)}$, an output neuron derivative $\nabla_Y^{(l)}$, or a weight derivative $\nabla_W^{(l)}$. In other words, each layer of the above-mentioned multi-layer network model may include input neurons, weights, output neurons, input neuron derivatives, weight derivatives, and output neuron derivatives. The above-mentioned decimal point position of the first input data may include a decimal point position of the input neuron, a decimal point position of the weight, a decimal point position of the output neuron, a decimal point position of the input neuron derivative, a decimal point position of the weight derivative, and a decimal point position of the neuron derivative. The input neurons, the weights, the output neurons, the input neuron derivatives, the weight derivatives, and the output neuron derivatives are all represented in a matrix or vector form. The operation unit 12 may be configured to acquire the maximum absolute value (that is, $$a_{max}^{(l)} = \max_i(\text{abs}(a_i^{(l)}))$$

of each category data by traversing all elements in the vector/matrix of each data of each layer of the above-mentioned multi-layer network model. The decimal point position $s_a^{(l)}$ of the input data a of each category of l-th layer is determined by a formula of $s_a^{(l)} = \lceil \log_2 a_{max}^{(l)} - \text{bitnum} + 1 \rceil$.

At step (a.3), the operation unit 12 may be configured to search the maximum absolute value by layer, data category, and group.

Specifically, the first input data may include each element $a_i^{(l)}$ in a vector/matrix, where $a^{(l)}$ may be input neurons $X^{(l)}$, output neurons $Y^{(l)}$, weights $W^{(l)}$, an input neuron derivative $\nabla_X^{(l)}$, an output neuron derivative $\nabla_Y^{(l)}$, or a weight derivative $\nabla_W^{(l)}$. In other words, data categories of each layer of the above-mentioned multi-layer network model may include input neurons, weights, output neurons, input neuron derivatives, weight derivatives, and output neuron derivatives. The above-mentioned operation unit 12 divides data of each category of each layer of the above-mentioned multi-layer network model into g groups, or into groups by other arbitrary grouping rules. The operation unit 12 then traverses each element of each group of data in the g groups data corresponding to the data of each category of each layer of the above-mentioned multi-layer network model, and obtains the element with the largest absolute value (that is, $$a_{max}^{(g,l)} = \max_i\left(\text{abs}\left(a_i^{(l,g)}\right)\right)$$

in the group of data. The decimal point position $s_a^{(l,g)}$ of data of each group of the g groups data corresponding to each category of each layer is determined by a formula of $s_a^{(l,g)} = \lceil \log_2 (a_{max}^{(l,g)}) - \text{bitnum} + 1 \rceil$.

The foregoing arbitrary grouping rules may include, but not limited to, rule for grouping according to data ranges, rule for grouping according to data training batches, and the like.

At step (b), the above-mentioned operation unit 12 initializes the decimal point position s of the first input data according to the minimum absolute value of the first input data.

Specifically, the above-mentioned operation unit 12 determines the minimum absolute value $a_{min}$ of data to be quantized, and determines the fixed-point precision s by the following formula.

$$s_a = \lfloor \log 2(a_{min}) \rfloor$$

The above-mentioned $a_{min}$ is the minimum absolute value of the first input data. For the process of acquiring $a_{min}$, please refer to the above-identified steps (a.1), (a.2), and (a.3).

At step (c), the above-mentioned operation unit 12 initializes the decimal point position s of the first input data according to the relationship between different data types in the first input data.

Specifically, the decimal point position $s_a^{(l)}$ of the data type $a^{(l)}$ of any layer (such as the first layer) of the multi-layer network model is determined by the above-mentioned operation unit 12 according to the decimal point position $s_b^{(l)}$ of the data type $b^{(l)}$ of the first layer and a formula of $s_a^{(l)} = \Sigma_{b \neq a} \alpha_b s_b^{(l)} + \beta_b$.

The $a^{(l)}$ and $b^{(l)}$ may be input neurons $X^{(l)}$, output neurons $Y^{(l)}$, weights $W^{(l)}$, input neuron derivatives $\nabla_X^{(l)}$, output neuron derivatives $\nabla_Y^{(l)}$, or weight derivatives $\nabla_W^{(l)}$. The $a^{(l)}$ and $b^{(l)}$ are integer constants.

At step (d), the above-mentioned operation unit 12 initializes the decimal point position s of the first input data according to the empirical value constant.

Specifically, the decimal point position $s_a^{(l)}$ of the data type $a^{(l)}$ of any layer (such as the first layer) of the multi-layer network model may be artificially set as $s_a^{(l)} = c$, where c is an integer constant. The above-mentioned $a^{(l)}$ may be input neurons $X^{(l)}$, output neurons $Y^{(l)}$, weights $W^{(l)}$, input neuron derivatives $\nabla_X^{(l)}$, output neuron derivatives $\nabla_Y^{(l)}$, or weight derivatives $\nabla_W^{(l)}$.

Further, an initialization value of the decimal point position of the input neuron and an initialization value of the decimal point position of the output neuron may be selected within the range of [−8, 8]. An initialization value of the decimal point position of the weight may be selected within the range of [−17, 8]. An initialization value of the decimal point position of the input neuron derivative and an initialization value of the decimal point position of the output neuron derivative may be selected within the range of [−40, −20]. An initialization value of the decimal point position of the weight derivative may be selected within the range of [−48, −12].

The method of dynamically adjusting the above-mentioned decimal point position of the data by the above-mentioned operation unit 12 will be specifically described as follows.

The method of dynamically adjusting the above-mentioned decimal point position s by the above-mentioned operation unit 12 may include adjusting the above-mentioned decimal point position s upwards (that is, value of the decimal point position s becomes larger) and adjusting the above-mentioned decimal point position s downwards (that is, value of the decimal point position s becomes smaller). Specifically, the above-mentioned decimal point position s is adjusted upwardly by a single step according to the maximum absolute value of the first input data. The above-mentioned decimal point position s is adjusted upwardly step by step according to the maximum absolute value of the first input data. The above-mentioned decimal point position s is adjusted upwardly by a single step according to the first input data distribution. The above-mentioned decimal point position s is adjusted upwardly step by step according to the first input data distribution. The above-mentioned decimal point position s is adjusted downwardly according to the absolute value of the first input date.

In case (a), the above-mentioned operation unit 12 may be configured to upwardly adjust the above-mentioned decimal point position s by a single step according to the maximum absolute value of the first input data.

Assuming that the above-mentioned decimal point position is s_old before being adjusted, the fixed-point data corresponding to the decimal point position s_old may represent data with a range of [neg, pos], where pos = $(2^{\text{bitnum}-1}-1)*2^{s\_old}$, neg = $-(2^{\text{bitnum}-1}-1)*2^{s\_old}$. If the maximum absolute value $a_{max}$ of the data in the first input data is greater than and equal to pos, the decimal point position adjusted is s_new = $\lceil \log_2 a_{max} - \text{bitnum} + 1 \rceil$; otherwise, the above-mentioned decimal point position will not be adjusted, that is, s_new = s_old.

In case (b), the above-mentioned operation unit 12 may be configured to upwardly adjust the above-mentioned decimal point position s step by step according to the maximum absolute value of the first input data.

Assuming that the above-mentioned decimal point position is s_old before being adjusted, the fixed-point data corresponding to the decimal point position s_old may represent data with a range of [neg, pos], where pos= $(2^{bitnum-1}-1)*2^{s\_old}$, neg=$-(2^{bitnum-1}-1)*2^{s\_old}$. If the maximum absolute value $a_{max}$ of the data in the first input data is greater than and equal to pos, the decimal point position adjusted is s_new=s_old+1; otherwise, the above-mentioned decimal point position will not be adjusted, that is s_new=s_old.

In case (c), the above-mentioned operation unit 12 may be configured to upwardly adjust the above-mentioned decimal point position s by a single step according to the first input data distribution.

Assuming that the above-mentioned decimal point position is s_old before being adjusted, the fixed-point data corresponding to the decimal point position s_old may represent data with a range of [neg, pos], where pos= $(2^{bitnum-1}-1)*2^{s\_old}$, neg=$-(2^{bitnum-1}-1)*2^{s\_old}$. Statistical parameters of the absolute value of first input data are processed, such as a mean value $a_{mean}$ of the absolute value and a standard deviation $a_{std}$ of the absolute value. The maximum range of data is set as $a_{max}=a_{mean}+na_{std}$. If $a_{max} \geq$ pos, s_new=$\lceil \log_2 a_{max}$-bitnum+1$\rceil$; otherwise, the above-mentioned decimal point position will not be adjusted, that is s_new=s_old.

Further, the above-mentioned n may be two or three.

In case (d), the above-mentioned operation unit 12 may be configured to upwardly adjust the above-mentioned decimal point position s step by step according to the first input data distribution.

Assuming that the above-mentioned decimal point position is s_old before being adjusted, the fixed-point data corresponding to the decimal point position s_old may represent data with a range of [neg, pos], where pos= $(2^{bitnum-1}-1)*2^{s\_old}$, neg=$-(2^{bitnum-1}-1)*2^{s\_old}$. The statistical parameters of the absolute value of first input data are processed, such as the mean value $a_{mean}$ of the absolute value and the standard deviation $a_{std}$ of the absolute value. The maximum range of data is set as $a_{max}=a_{mean}+na_{std}$, where n is three. If $a_{max} \geq$ pos, s_new=s_old+1; otherwise, the above-mentioned decimal point position will not be adjusted, that is s_new=s_old.

In case (e), the above-mentioned operation unit 12 may be configured to downwardly adjust the above-mentioned decimal point position s according to the absolute value of the first input date.

Assuming that the above-mentioned decimal point position is s_old before being adjusted, the fixed-point data corresponding to the decimal point position s_old may represent data with a range of [neg, pos], where pos= $(2^{bitnum-1}-1)*2^{s\_old}$, neg=$-(2^{bitnum-1}-1)*2^{s\_old}$. If the maximum absolute value $a_{max}$ of the first input date is less than $2^{s\_old+(bitnum-n)}$, and s_old$\geq s_{min}$, s_new=s_old, where the n is an integer constant, and the $s_{min}$ may be an integer or a negative infinity.

Further, the above-mentioned n is three, and the above-mentioned $s_{min}$ is −64.

In an example, an adjusting frequency of the decimal point position may be determined as follows. The decimal point position of the first input data may never be adjusted. Alternatively, the decimal point position of the first input data may be adjusted every n first training cycles (i.e., iteration), where the n is a constant. Alternatively, the decimal point position of the first input data may be adjusted every n second training cycles (i.e., epoch), where the n is a constant. Alternatively, the decimal point position of the first input data may be adjusted every n first training periods or n second training periods, and adjusting the decimal point position of the first input data every n first training periods or second training periods, and then the n may be adjusted, that is, n=αn, where α is greater than one. Alternatively, the decimal point position of the first input data may be adjusted every n first training period or second training period, and the n is gradually decreased as the number of training rounds increases.

Further, the decimal point position of the input neuron, the decimal point position of the weight, and the decimal point position of the output neuron may be adjusted every 100 first training cycles. The decimal point position of the input neuron derivative and the decimal point position of the output neuron derivative may be adjusted every 20 first training cycles.

It should be noted that the first training period is the time required to train a batch of samples, and the second training period is the time required to perform training for all training samples.

In an example, if the controller unit 11 or the operation unit 12 obtains the decimal point position of the first input data according to the above-identified process, the decimal point position of the first input data is stored in the cache 202 of the storage unit 10.

If the above-mentioned computation instruction is an immediate address instruction, the primary processing unit 101 directly converts the first input data into the second input data according to the decimal point position indicated by the opcode field of the computation instruction. If the above-mentioned computation instruction is a direct addressing instruction or an indirect addressing instruction, the primary processing unit 101 obtains the decimal point position of the first input data according to the storage space indicated by the opcode field of the computation instruction. The first input data is then converted to the second input data according to the decimal point position.

The above-mentioned computation device may also include a rounding unit. During the operation, the accuracy of the operation result obtained by adding, multiplying, and/or other operations on the second input data (the operation result may include the intermediate results and the computation result of the computation instruction) exceeds the accuracy range of the current fixed-point data. Therefore, a data cache unit may be configured to buffer the above-mentioned intermediate results. After the end of the operation, the rounding unit performs a rounding operation on the operation result exceeding the precision range of the fixed-point data, and obtains the rounded operation result. After the operation is completed, the rounding unit rounds the operation result exceeding the precision range of the fixed-point data, and obtains a rounded operation result. The data conversion unit then converts the rounded operation result into data of the type of the current fixed-point data.

Specifically, the rounding unit performs a rounding operation on the intermediate results, where the rounding operation may be any one of a random rounding operation, a rounding-off operation, a rounding-up operation, a rounding-down operation, and a truncation rounding operation.

If the rounding unit performs the random rounding operation, the rounding unit performs the following operations.

$$y = \begin{cases} \lfloor x \rfloor & w \cdot p \cdot 1 - \dfrac{x - \lfloor x \rfloor}{\varepsilon} \\ \lfloor x \rfloor + \varepsilon & w \cdot p \cdot \dfrac{x - \lfloor x \rfloor}{\varepsilon} \end{cases}$$

The y represents data obtained by performing random rounding operation on the operation result x before rounding, that is, the above-mentioned rounded operation result. The ε represents the minimum positive number that may be represented by the current fixed-point data representation format, that is, $2^{-Point\ Location}$. The $\lfloor x \rfloor$ represents data obtained by directly truncating the fixed-point data from the operation result x before rounding (similar to rounding down the decimal). The w.p. represents a probability. A probability expressed by the above-identified formula of obtaining the data $\lfloor x \rfloor$ by performing random rounding operation on the operation result x before rounding is $$1 - \frac{x - \lfloor x \rfloor}{\varepsilon}.$$

A probability of obtaining data $\lfloor x \rfloor + \varepsilon$ by performing random rounding operation on the intermediate result x before rounding is $$\frac{x - \lfloor x \rfloor}{\varepsilon}.$$

If the rounding unit performs the rounding-off operation, the rounding unit performs the following operations.

$$y = \begin{cases} \lfloor x \rfloor & \text{if } \lfloor x \rfloor \leq x \leq \lfloor x \rfloor + \frac{\varepsilon}{2} \\ \lfloor x \rfloor + \varepsilon & \text{if } \lfloor x \rfloor + \frac{\varepsilon}{2} \leq x \leq \lfloor x \rfloor + \varepsilon \end{cases}$$

The y represents data obtained by performing rounding-off operation on the operation result x before rounding, that is, the above-mentioned rounded operation result. The ε represents the minimum positive number that may be represented by the current fixed-point data representation format, that is, $2^{-Point\ Location}$. The $\lfloor x \rfloor$ is an integral multiple of the ε, and a value of the $\lfloor x \rfloor$ is a maximum number less than or equal to the x. If operation result x before rounding satisfies a condition of $$\lfloor x \rfloor \leq x \leq \lfloor x \rfloor + \frac{\varepsilon}{2},$$

the above-mentioned rounded operation result is $\lfloor x \rfloor$. If operation result x before rounding satisfies a condition of $$\lfloor x \rfloor + \frac{\varepsilon}{2} \leq x \leq \lfloor x \rfloor + \varepsilon,$$

the above-mentioned rounded operation result is $\lfloor x \rfloor + \varepsilon$.

If the rounding unit performs the rounding-up operation, the rounding unit performs the following operations.

$$y = \lceil x \rceil$$

The y represents data obtained by performing rounding-up operation on the operation result x before rounding, that is, the above-mentioned rounded operation result. The $\lceil x \rceil$ is an integral multiple of the ε, and a value of the $\lceil x \rceil$ is a maximum number less than or equal to the x. The ε represents the minimum positive number that may be represented by the current fixed-point data representation format, that is, $2^{-Point\ Location}$.

If the rounding unit performs the rounding-down operation, the rounding unit performs the following operations.

$$y = \lfloor x \rfloor$$

The y represents data obtained by performing rounding-up operation on the operation result x before rounding, that is, the above-mentioned rounded operation result. The $\lfloor x \rfloor$ is an integral multiple of the ε, and a value of the $\lfloor x \rfloor$ is a maximum number less than or equal to the x. The ε represents the minimum positive number that may be represented by the current fixed-point data representation format, that is, $2^{-Point\ Location}$.

If the rounding unit performs the truncation rounding operation, the rounding unit performs the following operations.

$$y = [x]$$

The y represents data obtained by performing truncation rounding operation on the operation result x before rounding, that is, the above-mentioned rounded operation result. The [x] represents data obtained by directly truncating the fixed-point data from the operation result x.

If the rounding unit obtains an intermediate result after the rounding (that is, a rounded intermediate result), the operation unit 12 converts the rounded intermediate result into data of the type of the current fixed-point data according to the decimal point position of the first input data.

In an example, the operation unit 12 does not perform truncation processing on at least one intermediate result whose data type is floating point type.

The secondary processing circuits 102 of the operation unit 12 perform operations to obtain the intermediate results according to the above-identified method. Since there are operations such as multiplication and division, which cause the intermediate results obtained to exceed the memory storage range, resulting that the intermediate results exceeding the memory storage range are generally truncated. However, since the intermediate results generated during the operation process of the present disclosure are not stored in the memory, it is not necessary to truncate the intermediate results exceeding the memory storage range, thereby greatly reducing the precision loss of the intermediate results and improving the accuracy of the computation result.

In an example, the operation unit 12 may further include a derivation unit. If the operation unit 12 receives the decimal point position of the input data involved in the fixed-point operation, the derivation unit derives a decimal point position of the at least one intermediate result obtained during the fixed-point operation according to the decimal point position of the input data involved in the fixed-point operation. If the intermediate result obtained by operation subunits exceeds the range indicated by the corresponding decimal point position, the derivation unit shifts the decimal point position of the intermediate result to the left by M bits, such that the accuracy of the intermediate result is within a precision range indicated by the decimal point position of the intermediate result, and the M is an integer greater than zero.

For example, the first input data may include the input data I1 and the input data I2, and the corresponding decimal point positions are P1 and P2, and P1>P2. If the operation type indicated by the above-mentioned operation instruction is an addition operation or a subtraction operation, that is, if the operation subunit performs the operation of I1+I2 or I1-I2, the derivation unit derives a decimal point position of the intermediate result of the operation process indicated by the operation instruction as P1. If the operation type indicated by the operation instruction is a multiplication operation, that is, if the operation subunit performs an I1*I2 operation, the derivation unit derives a decimal point position of the intermediate result of the operation process indicated by the operation instruction as P1*P2.

In an example, the operation unit 12 may further include a data cache unit for buffering the at least one intermediate result.

In an example, the computation device may further include a data statistical unit. The data statistical unit may be configured to perform statistics on the input data of the same type of the each layer in the multi-layer network model, so as to obtain the decimal point position of each type of each layer of the multi-layer network model.

The data statistical unit may also be part of an external device. The computation device obtains a decimal point position of data involving operations from the external device before performing the data conversion.

Specifically, the data statistical unit may include an acquiring subunit, a statistical subunit, and an analysis subunit.

The acquiring subunit may be configured to extract the input data of the same type of the each layer in the multi-layer network model.

The statistical subunit may be configured to compute and obtain a distribution ratio of the input data of the same type of the each layer in the multi-layer network model on a preset interval;

The analysis subunit may be configured to obtain a decimal point position of the input data of the same type of the each layer in the multi-layer network model according to the distribution ratio.

The preset interval may be $[-2^{X-1-i}, 2^{X-1-i}-2^{-i}]$, i=0,1, 2, ..., n, n is a preset positive integer, and X is a bit number occupied by the fixed-point data. The above-mentioned preset interval $[-2^{X-1-i}, 2^{X-1-i}-2^{-i}]$ may include n+1 subintervals. The statistical subunit may be configured to count distribute information of the input data of the same type of the each layer in the multi-layer network model on the n+1 subintervals, and to obtain a first distribution ratio according to the distribution information. The first distribution ratio is $p_0, p_1, p_2, \ldots, p_n$. The n+1 values of the first distribution ratio distribution are ratios of the input data of the same type of the each layer in the multi-layer network model in the n+1 subintervals. The analysis subunit sets an overflow rate EPL in advance, and obtains a maximum value i from 0, 1, 2, ..., n such that $p_i \geq 1-EPL$. The maximum value i is the decimal point position of the input data of the same type of the each layer in the multi-layer network model. In other words, the analysis subunit takes the decimal point position of the input data of the same type of the each layer in the multi-layer network model as $\max\{i/p_i \geq 1-EPL, i \in \{0,1, 2, \ldots, n\}\}$, that s, a largest subscript value i is selected as the decimal point position of the input data of the same type of the each layer in the multi-layer network model from the $p_i$ which is greater than or equal to 1-EPL.

It should be noted that, the $p_i$ is a ratio of the number of the input data of the same type of the each layer in the multi-layer network model whose value ranged in the interval $[-2^{X-1-i}, 2^{X-1-i}-2^{-i}]$ to the total number of the input data of the same type of the each layer in the multi-layer network model. For example, there are m1 input data of the same type of the each layer in the multi-layer network model, and m2 input data of the m1 input data are in the interval $[-2^{X-1-i}, 2^{X-1-i}-2^{-i}]$, and then $$p_i = \frac{m2}{m1}.$$

In an example, in order to improve the operation efficiency, the acquiring subunit may be configured to randomly or sample extract part of the input data of the same type of the each layer in the multi-layer network model, to acquire the decimal point position of the part of the input data according to the above-identified method, and to perform data conversion on the decimal point position of the part of the input data (including conversion of floating point data into fixed-point data, conversion of fixed-point data into fixed-point data, conversion of fixed-point data into fixed-point data, etc.), thereby improving the computation speed and efficiency under the premise of maintaining accuracy.

In an example, the data statistical unit may determine the bit width and the decimal point position of the input data of the same type or the input data of the same layer according to a median value of the input data of the same type or the input data of the same layer. Alternatively, the data statistical unit may determine the bit width and the decimal point position of the input data of the same type or the input data of the same layer according to an average value of the input data of the same type or the input data of the same layer.

In an example, if the operation unit may be configured to perform operations on the input data of the same type or the input data of the same layer to obtain an intermediate result, and the intermediate result exceeds a value range corresponding to the decimal point position and the bit width of the input data of the same type or the input data of the same layer, the operation unit does not perform truncation processing on the intermediate result, and caches the intermediate result in the data cache unit of the operation unit for subsequent operations.

Specifically, the opcode field may include a decimal point position and an identifier of data type conversion of the input data. The instruction processing unit parses the data conversion instruction to obtain the decimal point position and the identifier of data type conversion of the input data. The instruction processing unit may further include a data conversion unit, and the data conversion unit converts the first input data into the second input data according to the decimal point position and the identifier of data type conversion of the input data.

It should be noted that the above-mentioned network model may include multiple layers, such as a fully coupled layer, a convolution layer, a pooling layer, and an input layer. In the above-mentioned at least one input data, the input data belonging to the same layer has the same decimal point position, that is, the above-mentioned input data of the same layer shares the same decimal point position.

The above-mentioned input data may include different types of data, such as input neurons, weights, and offset data. The input data of the same type in the input data has the same decimal point position, that is, the above-mentioned input data of the same type shares the same decimal point position.

For example, if the operation type indicated by the operation instruction is a fixed-point operation, and the input data involved in the operation indicated by the operation instruction is floating point data, the data conversion unit converts the input data from the floating point data to fixed-point data before performing the fixed-point operation. For another example, if the operation type indicated by the operation instruction is a floating point operation, and the input data involved in the operation indicated by the operation instruction is fixed-point data, the data conversion unit converts the input data corresponding to the operation instruction from fixed-point data to floating point data before performing the floating point operation.

For macro instructions (such as the computation instruction and the data conversion instruction) involved in the present disclosure, the controller unit 11 may parse the macro instruction to obtain an opcode field and an opcode of the macro instruction. A micro instruction corresponding to the macro instruction is generated according to the opcode field and the opcode. Alternatively, the controller unit 11 decodes the macro instruction to obtain the micro instruction corresponding to the macro instruction.

In an example, a main processor and a coprocessor are included in a system on chip (SOC), and the main processor may include the above-mentioned computation device. The coprocessor obtains the decimal point position of input data of the same type of the each layer in the multi-layer network model according to the above-identified method, and sends the decimal point position of the input data of the same type of the each layer in the multi-layer network model to the computation device. Alternatively, if the computation device needs to use the decimal point position of the input data of the same type of the each layer in the multi-layer network model, the decimal point position of the input data of the same type of the each layer in the multi-layer network model is obtained from the above-mentioned coprocessor.

In an example, the first input data is non-fixed-point data, and the non-fixed-point data may include long-digit floating point data, short-digit floating point data, integer data, and discrete data.

The data types of the above-mentioned first input data are different from each other. For example, the input neurons, weights, and offset data are floating point data. Alternatively, some of the input neurons, weights, and offset data are floating point data, and some of the input neurons, weights, and offset data are integer data. Alternatively, the above-mentioned input neurons, weights, and offset data are all integer data. The computation device may realize the conversion of non-fixed-point data to fixed-point data, that is, the computation device may realize the conversion of data such as long-digit floating point data, short-digit floating point data, integer data, and discrete data to fixed-point data. The fixed-point data may be signed fixed-point data or unsigned fixed-point data.

In an example, the first input data and the second input data are both fixed-point data, and the first input data and the second input data may both be signed fixed-point data, or both are unsigned fixed-point data. Alternatively, one of the first input data and the second input data is unsigned fixed-point data and the other is signed fixed-point data. And the decimal point position of the first input data is different from that of the second input data.

In an example, the first input data is fixed-point data, and the second input data is non-fixed-point data. In other words, the computation device may realize the conversion of fixed-point data to non-fixed-point data.

Figure 4:
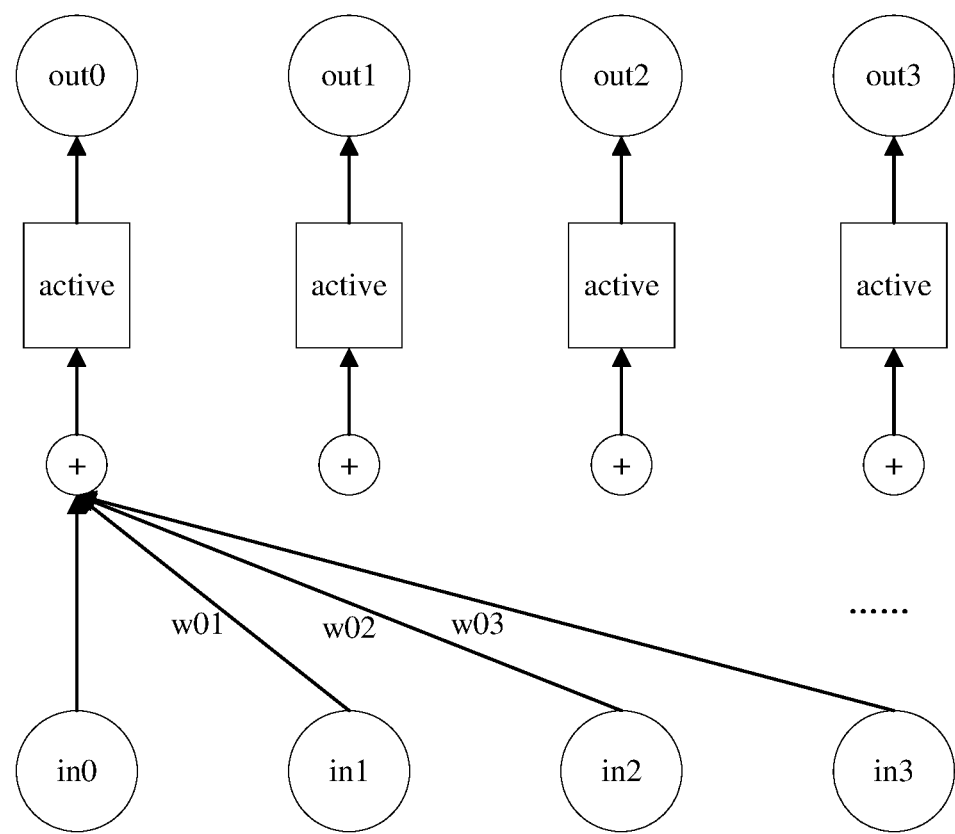
FIG. 4 is a flow chart of a forward operation of a single-layer artificial neural network according to an example of the present disclosure.

FIG. 4 is a flow chart of a forward operation of a single-layer neural network according to an example of the present disclosure. The flow chart depicts a forward operation process of a single layer neural network implemented by using the computation device and an instruction set of the present disclosure. For each layer, an input neuron vector is first weighted and summed to compute an intermediate result vector of the layer. The intermediate result vector is offset and activated to obtain an output neuron vector. The output neuron vector is used as an input neuron vector of the next layer.

In a specific application scenario, the computation device may be a training device. Before training the neural network model, the training device may be configured to acquire training data involved in a training of the neural network model, and the training data is non-fixed-point data. The training device may be further configured to obtain decimal point position of the training data according to the above-identified method. The training device converts the training data into training data represented by fixed-point data according to the decimal point position of the training data. The training device performs a forward neural network operation based on the training data represented by fixed-point data to obtain a neural network operation result. The training device performs a random rounding operation on the neural network operation result exceeding a range of data precision represented by the decimal point position of the training data, to obtain a rounded neural network operation result, where the neural network operation result is located in the range of data precision represented by the decimal point position of the training data. According to the above-identified method, the training device acquires the neural network operation result (that is, the output neurons) of each layer of the multi-layer neural network. The training device obtains an output neuron gradient according to the output neurons of each layer, and performs a reverse operation according to the output neuron gradient to obtain a weight gradient, thereby updating the weights of the neural network model according to the weight gradient.

The above-mentioned training device repeatedly performs the above-identified process to achieve the purpose of training the neural network model.

It should be noted that, before the forward operation and a reverse training, the computation device performs data conversion on the data involved in the forward operation, and does not perform data conversion on the data involved in the reverse training. Alternatively, the computation device does not perform data conversion on data involved in the forward operation, and performs data conversion on the data participating in the reverse training. Alternatively, the computation device performs data conversion on data involved in the reverse training and on data involved in the forward operation. The specific data conversion process may be referred to the description of the above-mentioned related examples, and will not be described herein.

The forward operation may include the above-mentioned multi-layer neural network operation, and the multi-layer neural network operation may include operations such as convolution, which is implemented by a convolution operation instruction.

The above-mentioned convolution operation instruction may be an instruction in the Cambricon instruction set. The Cambricon instruction set is characterized in that the instruction may include an opcode and operands. The instruction set may include four types of instructions, that is, control instructions, data transfer instructions, operation instructions, and logical instructions.

Preferably, each instruction in the instruction set has a fixed length. For example, each instruction in the instruction set may be 64 bits in length.

Further, the control instructions may be configured to control an execution process. The control instructions include jump instructions and conditional branch instructions.

Further, the data transfer instructions may be configured to complete data transfer between different storage media. The data transfer instruction may include a load instruction, a store instruction, and a move instruction. The load instruction may be configured to load data from a main memory to a cache, the store instruction may be configured to store data from the cache to the main memory, and the move instruction may be configured to transfer data between the cache and the cache, or between the cache and registers, or between registers and registers. The data transfer instructions support three different ways of organizing data, which include matrices, vectors, and scalars.

Further, the operation instructions may be configured to perform neural network operations. The operation instruction may include a matrix operation instruction, a vector operation instruction, and a scalar operation instruction.

Furthermore, the matrix operation instruction performs matrix operations in neural networks, which include operations of matrix multiplying vector, vector multiplying matrix, and matrix multiplying scalar, outer products, matrix adding matrix, matrix subtracting matrix.

Furthermore, the vector operation instruction performs vector operations in the neural networks, which include operations of vector elementary arithmetic, vector transcendental functions, dot products, random vector generators, and maximum/minimum of a vector). The elementary arithmetic include vector addition, vector subtraction, vector multiplication, and vector division. The vector transcendental functions are functions that do not satisfy any polynomial equations that use polynomials as coefficients, including but not limited to exponential functions, logarithmic functions, trigonometric functions, and inverse trigonometric functions.

Furthermore, the scalar operation instruction performs scalar operations in the neural networks, including scalar elementary arithmetic and scalar transcendental functions. The scalar basic operations include scalar addition, scalar subtraction, scalar multiplication, and scalar division, the scalar transcendental functions are functions that do not satisfy any polynomial equations that use polynomials as coefficients, including but not limited to exponential functions, logarithmic functions, trigonometric functions, and inverse trigonometric functions.

Further, the logical instructions may be configured to perform logical operations in the neural networks. The logical operations include vector logical operation instructions and scalar logical operation instructions.

Furthermore, the vector logical operation instruction may include a vector comparison, a vector logical operation, and a vector greater than merge. The vector comparison may include, but are not limited to, greater than, less than, equal to, greater than or equal to, less than or equal to, and not equal to. The vector logical operations include with, or, not.

Further, the scalar logical operations may include scalar comparison, scalar logical operations. The scalar comparison may include, but is not limited to, greater than, less than, equal to, greater than or equal to, less than or equal to, and not equal to. The scalar logical operations include AND, OR, and NOT.

Figure 5:
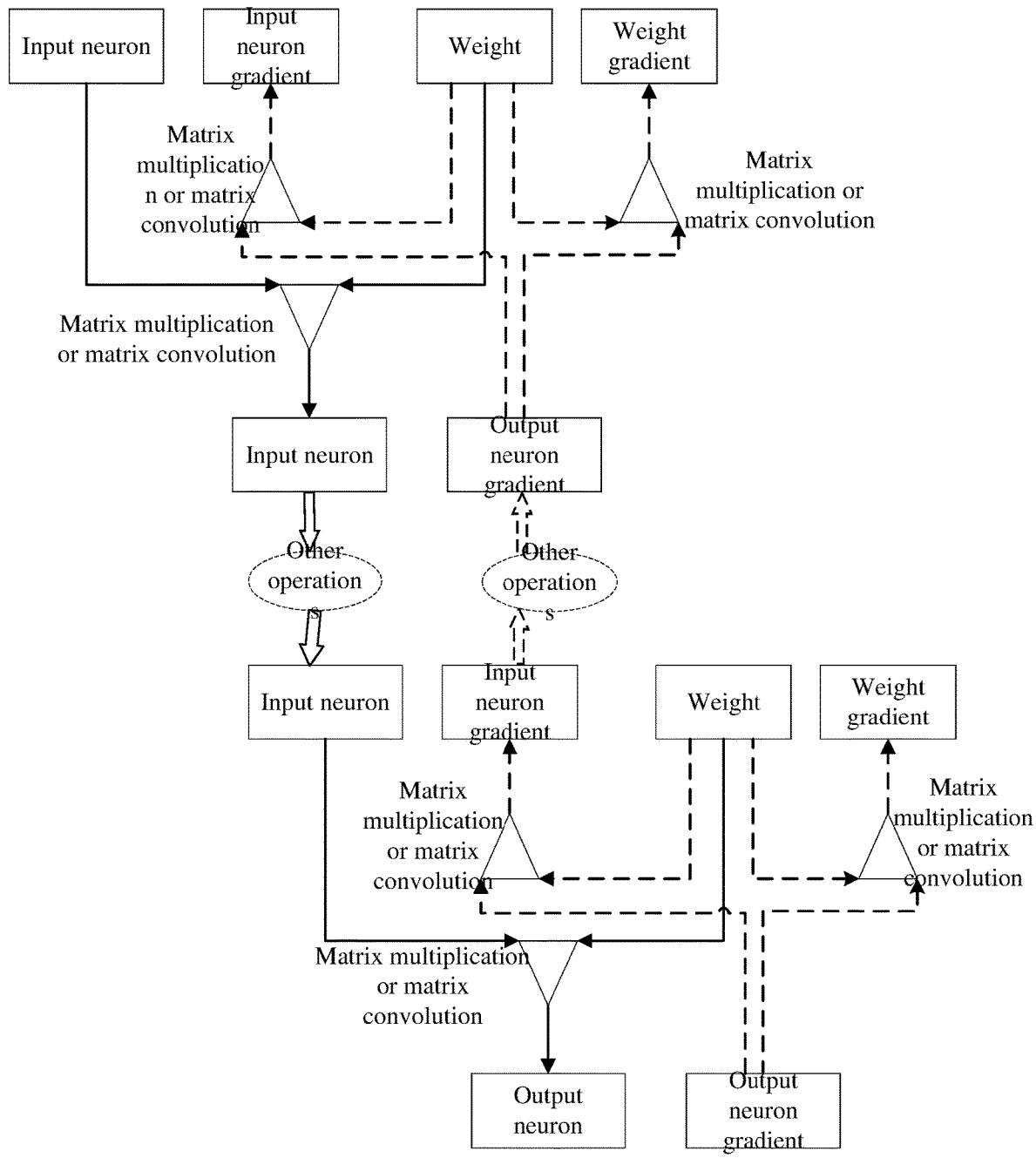
FIG. 5 is a flow chart of a forward and reverse training of a neural network according to an example of the present disclosure.

For a multi-layer neural network, the implementation process may be executed as follows. In the forward operation, if the forward operation of a previous layer artificial neural network is completed, operation instructions of a next layer will operate the output neuron processed in the operation unit as the input neuron of the next layer (or perform some operations on the output neuron, and then the output neuron is operated as the input neuron of the next layer). At the same time, the weight is also replaced by the weight of the next layer. In the reverse operation, if the reverse operation of a previous artificial neural network is completed, operation instructions of a next layer will operate an input neuron gradient processed in the operation unit as an output neuron gradient of the next layer (or perform some operations on the input neuron gradient, and then the input neuron gradient is operated as the output neuron gradient of the next layer). At the same time, the weight is also replaced by the weight of the next layer. As illustrated in FIG. 5, arrows of the broken line in FIG. 5 indicate the reverse operation, and arrows of the solid line indicate the forward operation.

In another example, the operation instruction may be a matrix multiplying matrix instruction, an accumulation instruction, an activation instruction, and the like. The operation instruction may include a forward operation instruction and a direction training instruction.

The specific computation method of the computation device illustrated in FIG. 3A is explained herein via the neural network operation instruction. For the neural network operation instruction, the formula that it actually needs to execute may be $s=s(\Sigma wx_i+b)$, where the weight w is multiplied by the input data, then a summation operation is performed, and then the offset b is added to perform the activation operation s(h) to obtain the final output result s.

The method for performing the neural network forward operation instruction by the computation device is illustrated in FIG. 3A, which may include the following.

If the conversion unit 13 has performed data type conversion on the first input data, the controller unit 11 extracts the neural network forward operation instruction, and an opcode field and at least one opcode corresponding to the neural network operation instruction from the instruction cache unit 110, and the controller unit 11 sends the opcode field to the data access unit, and sends the at least one opcode to the operation unit 12.

The controller unit 11 extracts the weight w and the offset b corresponding to the opcode field from the storage unit 10 (if b is zero, the offset b does not need to be extracted). The weight w and the offset b are sent to the primary processing circuit 101 of the operation unit, and the controller unit 11 extracts the input data Xi from the storage unit 10, and sends the input data Xi to the primary processing circuit 101.

The primary processing circuit 101 divides the input data Xi into n data blocks.

The instruction processing unit 111 of the controller unit 11 determines a multiplication instruction, an offset instruction, and an accumulation instruction according to the at least one opcode, and sends the multiplication instruction, the offset instruction, and the accumulation instruction to the primary processing circuit 101. The primary processing circuit 101 broadcasts the multiplication instruction and the weight w to the multiple secondary processing circuits 102, and distributes the n data blocks to the multiple secondary processing circuits 102 (for example, there are n secondary processing circuits 102, then each secondary processing circuit 102 is distributed with one data block). The multiple secondary processing circuits 102 perform multiplication operations on the data blocks received and the weight w to obtain intermediate results according to the multiplication instruction, and send the intermediate results to the primary processing circuit 101. The primary processing circuit 101 performs an accumulation operation on the intermediate results sent by the multiple secondary processing circuits 102 to obtain an accumulation result according to the accumulation instruction, and performs an addition operation on the accumulation result and the offset b to obtain the final result according to the offset instruction, and sends the final result to the controller unit 11.

In addition, the order of the addition operation and the multiplication operation may be reversed.

It should be noted that the method for performing the neural network reverse training instruction by the above-mentioned computation device is similar to a method for performing the neural network forward operation instruction by the above-mentioned computation device. Specific details may refer to the related description of the reverse training, which are not described herein.

The technical solution provided by the present application may realize the multiplication operation and the offset operation of the neural network through an instruction (that is, the neural network operation instruction), and the intermediate results of the neural network operation may be performed without storage and extraction operations, which may reduce the storage and extraction operations of the intermediate data. Therefore, the technical solution provided by the present application may reduce the corresponding operational steps and improve the computational effect of the neural network.

A machine learning operation device may be further provided. The machine learning operation device may include one or more computation devices mentioned in the present disclosure for acquiring data to be processed and control information from other processing devices, performing specified machine learning computations, and sending execution results to peripheral devices through I/O interfaces. The peripherals include cameras, monitors, mice, keyboards, network cards, WIFI interfaces, servers, and the like. If multiple computation devices are provided, the computation devices may link and transfer data with each other through a specific structure. For example, data may be interconnected and transmitted via the PCIE bus, so as to support larger scale machine learning computations. In this case, the multiple computation devices may share the same control system, or have separate control systems. Further, the multiple computation devices may share the same memory, or each accelerator may have its own memory. In addition, the interconnection method may be any interconnection topology.

The machine learning operation device may have high compatibility and may be coupled with various types of servers through the PCIE interface.

The present disclosure also discloses a combined processing device, which may include the above-mentioned machine learning operation device, universal interconnection interfaces, and other processing devices. The machine learning operation device interacts with other processing devices to perform user-specified operations. FIG. 6 is a schematic diagram illustrated the combined processing device.

The other processing devices may include at least one of general purpose/dedicated processors such as a central processing unit (CPU), a graphics processing unit (GPU), a machine learning processor, and the like. The number of processors included in other processing devices is not limited. The other processing devices served as an interface between the machine learning operation device and external data and control, may include data handling, and perform the basic control of start and stop operations of the machine learning operation device. The other processing devices may also cooperate with the machine learning operation device to complete the computing task.

The universal interconnection interfaces for sending data and control instructions between the machine learning operation device and the other processing devices. The machine learning operation device may obtain the input data required from the other processing devices, and writes the input data required into on-chip storage devices of the machine learning operation device. The machine learning operation device may acquire control instructions from the other processing devices, and writes the control instructions into on-chip control caches of the machine learning operation device. The machine learning operation device may read data in the storage module of the machine learning operation device and transmit the data to the other processing devices.

Figure 7:
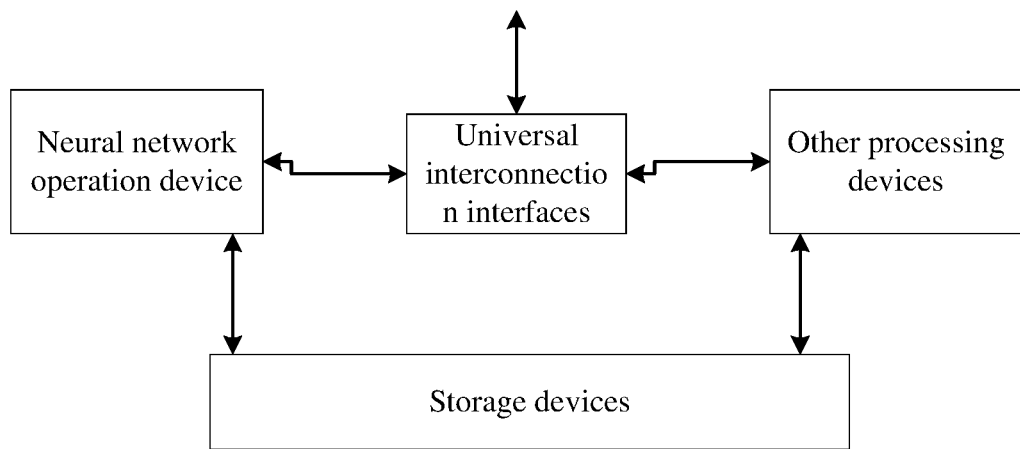
FIG. 7 is a structural diagram of another combined processing device according to an example of the present disclosure.

In an example, a structure of another combined processing device is as illustrated in FIG. 7. A storage device may be further provided, the storage device is respectively coupled with the machine learning operation device and the other processing device. The storage device may be configured to store data in the machine learning operation device and the other processing devices, and is particularly suitable for storing data to be processed which may not be completely stored in the internal storage of the machine learning operation device or the other processing devices.

The combined processing device may be used as an SOC on-chip system of devices such as mobile phones, robots, drones, video monitoring devices, etc., thereby effectively reducing the core area of control parts, increasing the processing speed, and reducing the overall power consumption. In this case, the universal interconnection interfaces of the combined processing device are coupled with certain components of the device. The components may include cameras, monitors, mice, keyboards, network cards, and WIFI interfaces.

In an example, a distributed system is also applied. The distributed system may include n1 main processors and n2 coprocessors. The n1 is an integer greater than or equal to zero, and the n2 is an integer greater than or equal to one. The distributed system may be various types of topologies including, but not limited to, topologies illustrated in FIG. 3B, FIG. 3C, FIG. 11, and FIG. 12.

The main processor sends the input data, the decimal point position of the input data, and the computation instruction to the multiple coprocessors. Alternatively, the main processor sends the input data, the decimal point position of the input data and the computation instruction to some of the multiple coprocessors, and the coprocessors further move the input data, the decimal point position of the input data, and the computation instruction to other coprocessors. The coprocessor may include the above-mentioned computation device, and the computation device performs operations on the input data according to the above-identified method and the computation instruction to obtain an operation result.

The input data may include, but not limited to, input neurons, weights, offset data, and the like.

The coprocessor sends the operation result directly to the main processor. Alternatively, the coprocessor without coupling relationship with the main processor sends the operation result to the coprocessor coupled with the main processor, and then the coprocessor coupled with the main processor sends the operation result received to the main processor.

In some examples, a chip may be provided. The chip may include the above-mentioned machine learning operation device or the combination processing device.

In some examples, a chip package structure may be provided. The chip package structure may include the above-mentioned chip.

In some examples, a board is provided. The board may include the above-mentioned chip package structure.

Figure 8:
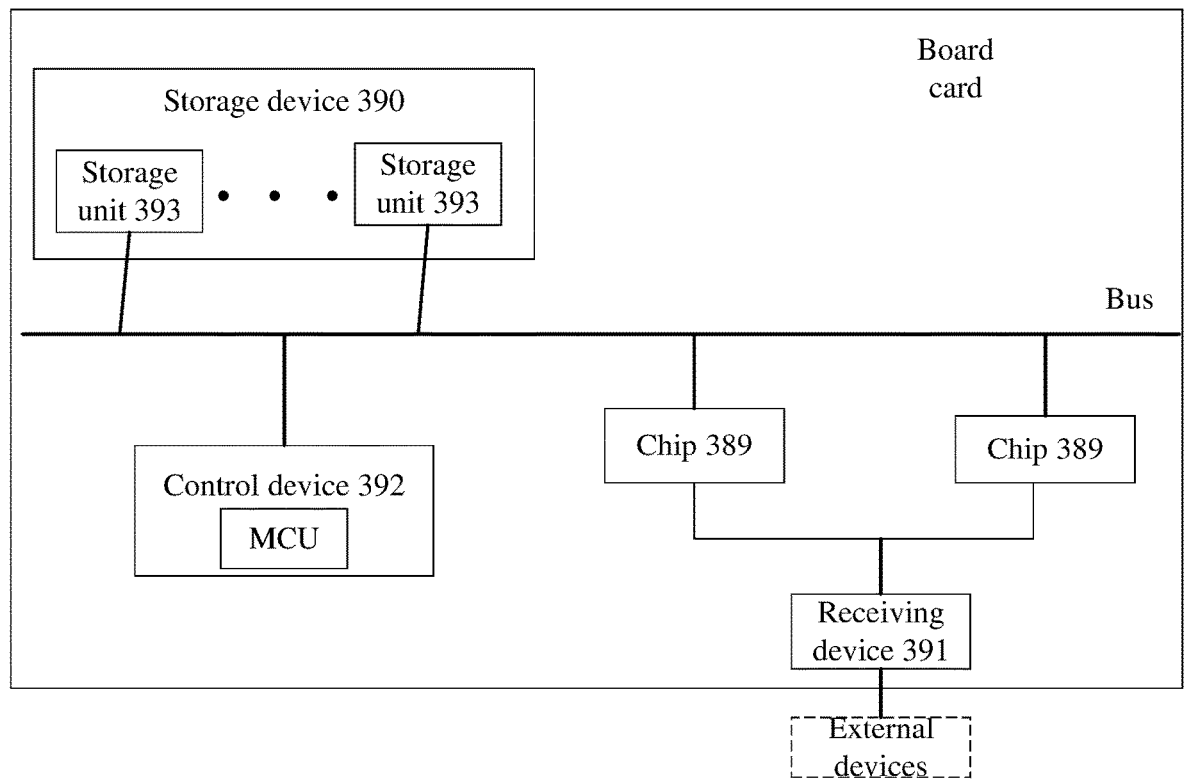
FIG. 8 is a schematic structural diagram of a board according to an example of the present disclosure.

In some examples, an electronic device may be provided. The electronic device may include the above-mentioned board. A board is illustrated in FIG. 8. In addition to the chip 389, the board may also include other supporting components including, but not limited to, a storage device 390, a receiving device 391, and a control device 392.

The memory device 390 for storing data is coupled with the chip in the chip package structure via a bus. The memory device may include multiple sets of storage units 393. Each set of the storage units 393 is coupled with the chip via the bus. It may be understood that each set of the storage units 393 may be a double data rate synchronous dynamic random access memory (DDR SDRAM).

The double data rate (DDR) is capable to double the speed of SDRAM without increasing the clock frequency. The DDR allows data to be read on rising and falling edges of the clock pulse. The DDR is twice as fast as the standard SDRAM. In one example, the storage device may include four sets of the storage units. Each set of the memory cells may include multiple DDR4 particles (chips). In one example, the chip may internally include four 72-bit DDR4 controllers. 64 bits of the 72-bit DDR4 controller are used for data transmission, and 8 bits of the 72-bit DDR4 controller are used for error checking and correcting (ECC) verification. It should be understood that if DDR4-3200 particles are used in each set of the storage units, a theoretical bandwidth of data transmission may reach 25600 MB/s.

In one example, each set of the memory cells may include multiple double rate synchronous dynamic random access memories arranged in parallel. The DDR may transfer data twice in one clock cycle. A controller for controlling the DDR is provided in the chip for controlling data transmission and data storage for each of the storage units.

The interface device is electrically coupled with the chip within the chip package structure. The interface device may be configured to implement data transmission between the chip and external devices such as a server and a computer. For example, in one example, the interface device may be a standard PCIE interface. For example, the data to be processed is transmitted to the chip by the server through a standard PCIE interface to implement data transmission. Preferably, if the data to be processed is transmitted over the PCIE 3.0×16 interface, the theoretical bandwidth may reach 16000 MB/s. In another example, the interface device may also be another interface. The application does not limit the specific expression of the other interfaces, and an interface unit capable of implementing the transfer function will be available. In addition, the computation result of the chip is still transmitted by the interface device back to the external devices (such as a server).

The control device is electrically coupled with the chip. The control device may be configured to monitor the status of the chip. Specifically, the chip may be electrically coupled with the control device through an SPI interface. The control device may include a micro controller unit (MCU). For example, the chip may include multiple processing chips, multiple processing cores, or multiple processing circuits, and multiple loads may be driven. Therefore, the chip may be in different operating states such as multiple loads and light loads. The control device may implement the control of the operating states of the multiple processing chips, the multiple processing cores, and/or the multiple processing circuits in the chip.

The electronic device may include data processing devices, robots, computers, printers, smayners, tablets, smart terminals, mobile phones, driving recorders, navigators, sensors, cameras, servers, cloud servers, cameras, cameras, projectors, watches, headphones, mobile storage, wearable devices, vehicles, household appliances, and/or medical devices.

The vehicle may include an aircraft, a ship, and/or a car. The household appliance may include a television, an air conditioner, a microwave oven, a refrigerator, a rice cooker, a humidifier, a washing machine, an electric lamp, a gas stove, a range hood. The medical device may include a nuclear magnetic resonance instrument, a B-ultrasound, and/or an electrocardiograph.

Figure 9:
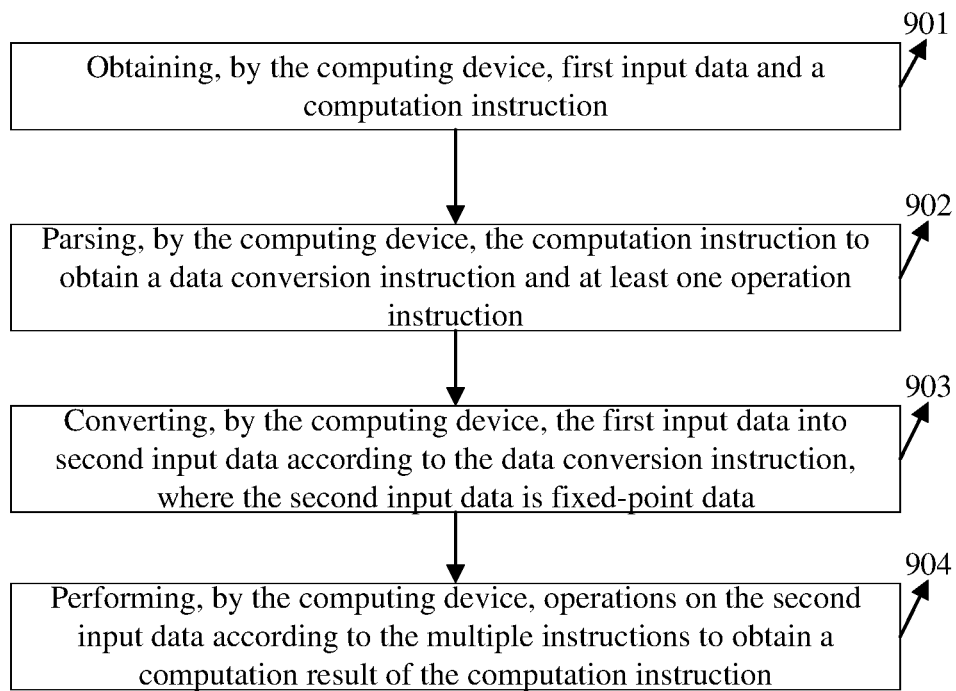
FIG. 9 is a schematic flow chart of a computation method according to an example of the present disclosure.

FIG. 9 is a schematic flow chart of a method for executing machine learning computations according to an example of the present disclosure. The method may include the following steps.

At S901, obtaining, by the computation device, first input data and a computation instruction, where the first input data may include input neurons and weights.

At S902, parsing, by the computation device, the computation instruction to obtain a data conversion instruction and an at least one operation instruction, where the data conversion instruction may include a data conversion instruction including an opcode field and an opcode, where the opcode indicates a function of the data conversion instruction, and the opcode field of the data conversion instruction may include information of a decimal point position, a flag bit indicating a data type of the first input data, and an identifier of data type conversion.

At S903, converting, by the computation device, the first input data into second input data according to the data conversion instruction, where the second input data is fixed-point data, where the converting the first input data into second input data by the computation device according to the data conversion instruction includes:

parsing the computation instruction to obtain information of the decimal point position, the flag bit indicating a data type of the first input data, and the data type conversion;

determining the data type of the first input data according to the flag bit indicating the data type of the first input data; and converting the first input data into the second input data according to the decimal point position and the data type conversion. The data type of the first input data is inconsistent with that of the second input data.

If the first input data and the second input data are fixed-point data, the decimal point position of the first input data is inconsistent with that of the second input data.

In an example, if the first input data is fixed-point data, the method may further include: deriving a decimal point position of at least one intermediate result according to the decimal point position of the first input data, where the at least one intermediate result is derived according to the first input data.

At S904, performing, by the computation device, operations on the second input data according to the multiple operation instructions to obtain a computation result of the computation instruction.

The operation instruction may include a forward operation instruction and a reverse training instruction. In other words, in the process of executing the forward operation instruction and the reverse training instruction (that is, the computation device performs the forward operation and/or the reverse training), the computation device may convert the data involved in operations into fixed-point data according to the example illustrated in FIG. 9 to perform fixed-point operations.

It should be noted that the detailed description of the foregoing steps S901-S904 may be referred to the related description of the example illustrated in FIGS. 1 to 8, which are not described herein.

Figure 10:
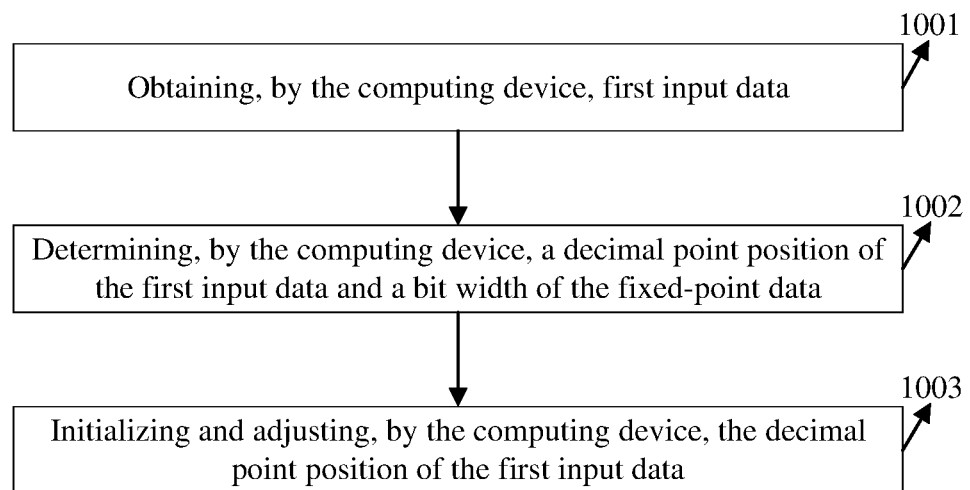
FIG. 10 is a schematic flow chart of a process for determining and adjusting a decimal point position of data according to an example of the present disclosure.
Figure 11:
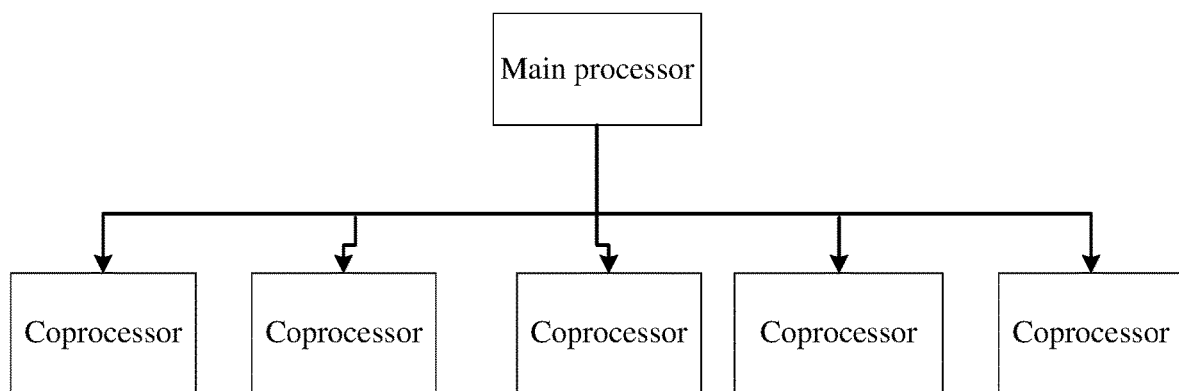
FIG. 11 is a schematic structural diagram of a distributed system according to an example of the present disclosure.
Figure 12:
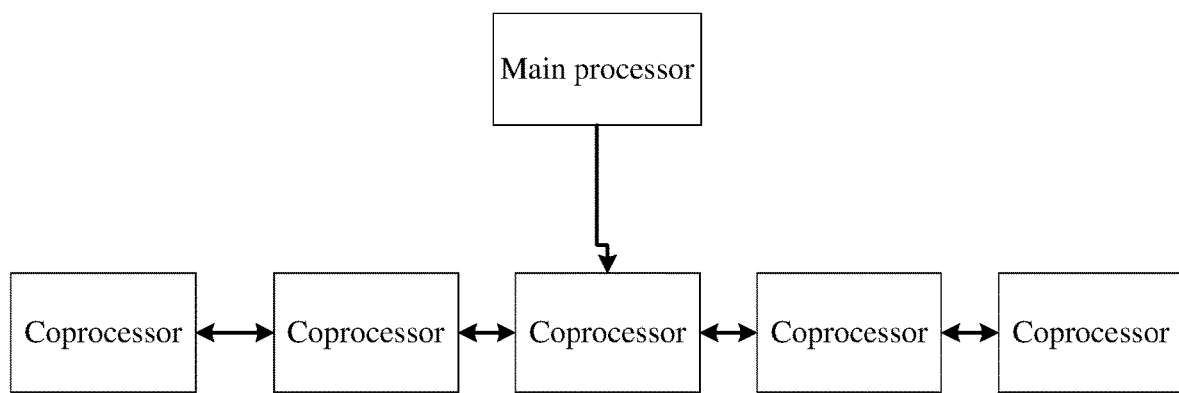
FIG. 12 is a schematic structural diagram of another distributed system according to an example of the present disclosure.

In a specific application scenario, the computation device may convert the data involved in operations into fixed-point data, and adjust the decimal point position of the fixed-point data. The specific process is illustrated in FIG. 10. The method may include the following steps.

At S1001, obtaining, by the computation device, the first input data.

The first input data is data involved in operations of $m^{th}$ layer of a multi-layer network model, and the first input data is any type of data. For example, the first input data is fixed-point data, floating point data, integer data or discrete data, and m is an integer greater than zero.

The $m^{th}$ layer of the above-mentioned multilayer network model is a linear layer, and the linear layer may include, but not limited to, a convolution layer and a fully coupled layer. The above-mentioned first input data may include input neurons, weights, output neurons, input neuron derivatives, weight derivatives, and output neuron derivatives.

At S1002, determining, by the computation device, a decimal point position of the first input data and a bit width of the fixed-point data.

The bit width of fixed-point data of the first input data is bits occupied by the first input data represented by fixed-point data. The above-mentioned decimal point position is bits occupied by a fractional part of the first data represented by fixed-point data. The decimal point position may be configured to indicate the accuracy of the fixed-point data. Referring to the related description of FIG. 2A for details.

In an example, the first input data may be any type of data, and first input data a is converted into the second input data â according to the decimal point position and the bit width of the fixed-point data, which is described as follows.

$$\hat{a} = \begin{cases} \lceil a/2^s \rceil * 2^s, & neg \leq a \leq pos \\ pos, & a > pos \\ neg, & a < neg \end{cases}$$

If the first input data a satisfies a condition of neg≤a≤pos, the second input data â is represented as $\lceil a/2^s \rceil * 2^s$. If the first input data a is greater than pos, the second input data â is represented as pos. If the first input data a is less than neg, the second input data â is represented as neg.

In an example, input neurons, weights, output neurons, input neuron derivatives, output neuron derivatives, and weight derivatives of a convolutional layer and a fully coupled layer are represented by fixed-point data.

In an example, the bit width of fixed-point data of the input neuron may be 8, 16, 32, 64, or other bits. Specifically, the bit width of fixed-point data of the input neuron is 8.

In an example, the bit width of fixed-point data of the weight may be 8, 16, 32, 64, or other bits. Specifically, the bit width of the fixed-point data of the weight is 8.

In an example, the bit width of fixed-point data of the input neuron derivative may be 8, 16, 32, 64, or other bits. Specifically, the bit width of fixed-point data of the input neuron derivative is 16 bits.

In an example, the bit width of fixed-point data of the output neuron derivative may be 8, 16, 32, 64, or other bits. Specifically, the bit width of fixed-point data of the output neuron derivative is 24 bits.

In an example, the bit width of fixed-point data of the weight derivative may be 8, 16, 32, 64, or other bits. Specifically, the bit width of fixed-point data of the weight derivative is 24 bits.

In an example, the data a with a large value in data involved in a multi-layer network model operation may adopt multiple representation manners of fixed-point data. Referring to the related description of FIG. 2B for details.

In an example, the first input data may be any type of data, and the first input data a is converted into the second input data â according to the decimal point position and the bit width of fixed-point data, which is described as follows.

$$\hat{a} = \begin{cases} \sum_{i}^{n} \hat{a}_i, & neg \leq a \leq pos \\ pos, & a > pos \\ neg, & a < neg \end{cases}$$

If the first input data a satisfies a condition of neg≤a≤pos, the second input data â is represented as $$\hat{a}_i = \left\lceil \frac{a - \hat{a}_i - 1}{2^{si}} \right\rceil * 2^{si},$$

where $\hat{a}_0 = 0$. If the first input data a is greater than pos, the second input data â is represented as pos. If the first input data a is less than neg, the second input data â is represented as neg.

At S1003, initializing, by the computation device, a decimal point position of the first input data and adjusts the decimal point position of the first input data.

The above decimal point position s need to be initialized and dynamically adjusted according to data of different categories, data of different neural network layers, and data of different iteration rounds.

An initialization process of the decimal point position s of the first input data is specifically described as follows, for example, the decimal point position adopted by the fixed-point data is determined if converting the first input data at the first time.

Where the initializing the computation device the decimal point positions of the first input data includes:

initializing the decimal point positions of the first input data according to the maximum absolute value of the first input data; initializing the decimal point position s of the first input data according to the minimum absolute value of the first input data; initializing the decimal point positions of the first input data according to relationship between different data types in the first input data; and initializing the decimal point positions of the first input data according to the empirical value constant.

Specifically, the above-mentioned initialization process is specifically described as follows.

At step (a), the computation device initializes the decimal point position s of the first input data according to the maximum absolute value of the first input data.

The above-mentioned computation device specifically initializes the decimal point positions of the first input data by performing an operation shown by the following formula.

$$s_a = \lceil \log_2 a_{max} - \text{bitnum} + 1 \rceil$$

The $a_{max}$ represents the maximum absolute value of the first input data. The bitnum represents the bit width of the fixed-point data converted from the first input data. The $s_a$ represents the decimal point position of the first input data.

According to categories and network levels, the data involved in operations may be divided into the input neuron $X^{(l)}$, the output neuron $Y^{(l)}$, the weight $W^{(l)}$, the input neuron derivative $\nabla_X^{(l)}$, the output neuron derivative $\nabla_Y^{(l)}$ and the weight derivative $\nabla_W^{(l)}$ of the l-th layer. The maximum absolute value may be searched by one of manners including searching by data category, searching by layer and data category, searching by layer, data category, and group. Determining the maximum absolute value of the first input data may include the following methods.

At step (a.1), the computation device searches the maximum absolute value by data category.

Specifically, the first input data may include each element $a_i^{(l)}$ in a vector/matrix, where the element $a_i^{(l)}$ may be an input neuron $X^{(l)}$, an output neuron $Y^{(l)}$, a weight $W^{(l)}$, an input neuron derivative $\nabla_X^{(l)}$, an output neuron derivative $\nabla_Y^{(l)}$, or a weight derivative $\nabla_W^{(l)}$. In other words, the above-mentioned first input data may include input neurons, weights, output neurons, input neuron derivatives, weight derivatives, and output neuron derivatives. The above-mentioned decimal point position of the first input data may include a decimal point position of the input neuron, a decimal point position of the weight, a decimal point position of the output neuron, a decimal point position of the input neuron derivative, a decimal point position of the weight derivative, and a decimal point position of the neuron derivative. The input neurons, the weights, the output neurons, the input neuron derivatives, the weight derivatives, and the output neuron derivatives are all represented in a matrix or vector form. The computation device acquires the maximum absolute value (that is, $$a_{max} = \max_{i,1}(\text{abs}(a_i^{(1)}))$$

of each category data by traversing all elements in the vector/matrix of each layer of the above-mentioned multi-layer network model. The decimal point position $s_a$ of the fixed-point data converted from the input data a of each category data is determined by a formula of $s_a = \lceil \log_2 a_{max} - \text{bitnum} + 1 \rceil$.

At step (a.2), the computation device searches the maximum absolute value by layer and data category.

Specifically, the first input data may include each element $a_i^{(l)}$ in a vector/matrix, where the $a^{(l)}$ may be an input neuron $X^{(l)}$, an output neuron $Y^{(l)}$, a weight $W^{(l)}$, an input neuron derivative $\nabla_X^{(l)}$, an output neuron derivative $\nabla_Y^{(l)}$, or a weight derivative $\nabla_W^{(l)}$. In other words, each layer of the above-mentioned multi-layer network model may include input neurons, weights, output neurons, input neuron derivatives, weight derivatives, and output neuron derivatives. The above-mentioned decimal point position of the first input data may include a decimal point position of the input neuron, a decimal point position of the weight, a decimal point position of the output neuron, a decimal point position of the input neuron derivative, a decimal point position of the weight derivative, and a decimal point position of the neuron derivative. The input neurons, the weights, the output neurons, the input neuron derivatives, the weight derivatives, and the output neuron derivatives are all represented in a matrix or vector form. The computation device acquires the maximum absolute value (that is, $$a_{max}^{(l)} = \max_{1}(\text{abs}(a_i^{(l)}))$$

of each category data by traversing all elements in the vector/matrix of each data of each layer of the above-mentioned multi-layer network model. The decimal point position $s_a^{(l)}$ of the input data a of each category of l-th layer is determined by a formula of $s_a^{(l)} = \lceil \log_2 a_{max}^{(l)} - \text{bitnum} + 1 \rceil$.

At step (a.3), the computation device searches the maximum absolute value by layer, data category, and group.

Specifically, the first input data may include each element $a_i^{(l)}$ in a vector/matrix, where $a^{(l)}$ may be input neurons $X^{(l)}$, output neurons $Y^{(l)}$, weights $W^{(l)}$, an input neuron derivative $\nabla_X^{(l)}$, an output neuron derivative $\nabla_Y^{(l)}$, or a weight derivative $\nabla_W^{(l)}$. In other words, data categories of each layer of the above-mentioned multi-layer network model may include input neurons, weights, output neurons, input neuron derivatives, weight derivatives, and output neuron derivatives. The above-mentioned computation device divides data of each category of each layer of the above-mentioned multi-layer network model into g groups, or into groups by other arbitrary grouping rules. The computation device then traverses each element of each group of data in the g groups data corresponding to the data of each category of each layer of the above-mentioned multi-layer network model, and obtains the element with the largest absolute value (that is, $$a_{max}^{(g,1)} = \max_{1}(\text{abs}(a_i^{(1,g)}))$$

in the group of data. The decimal point position $s_a^{(l,g)}$ of data of each group of the g groups data corresponding to each category of each layer is determined by a formula of $s_a^{(l,g)} = \lceil \log_2(a_{max}^{(l,g)} - \text{bitnum} + 1) \rceil$.

The foregoing arbitrary grouping rules include, but are not limited to, rule for grouping according to data ranges, rule for grouping according to data training batches, and the like.

At step (b), the computation device initializes the decimal point position s of the first input data according to the maximum absolute value of the first input data.

Specifically, the computation device determines the minimum absolute value $a_{min}$ of data to be quantized, and determines the fixed-point precision s by the following formula.

$$s_a = \lfloor \log 2(a_{min}) \rfloor$$

The above-mentioned $a_{min}$ is the minimum absolute value of the first input data. For the process of acquiring $a_{min}$, please refer to the above-identified steps (a.1), (a.2), and (a.3).

At step (c), the computation device initializes the decimal point position s of the first input data according to the relationship between different data types in the first input data.

Specifically, the decimal point position $s_a^{(l)}$ of the data type $a^{(l)}$ of any layer (such as the first layer) of the multi-layer network model is determined by the above-mentioned operation unit 12 according to the decimal point position $s_b^{(l)}$ of the data type $b^{(l)}$ of the first layer and a formula of $s_a^{(l)} = \Sigma_{b \neq a} \alpha_b s_b^{(l)} + \beta_b$.

The $a^{(l)}$ and $b^{(l)}$ may be input neurons $X^{(l)}$, output neurons $Y^{(l)}$, weights $W^{(l)}$, input neuron derivatives $\nabla_X^{(l)}$, output neuron derivatives $\nabla_Y^{(l)}$, or weight derivatives $\nabla_W^{(l)}$. The $a^{(l)}$ and $b^{(l)}$ are integer constants.

At step (d), the computation device initializes the decimal point position s of the first input data according to the empirical value constant.

Specifically, the decimal point position $s_a^{(l)}$ of the data type $a^{(l)}$ of any layer (such as the first layer) of the multi-layer network model may be artificially set as $s_a^{(l)} = c$, where c is an integer constant. The above-mentioned $a^{(l)}$ may be input neurons $X^{(l)}$, output neurons $Y^{(l)}$, weights $W^{(l)}$, input neuron derivatives $\nabla_X^{(l)}$, output neuron derivatives $\nabla_Y^{(l)}$, or weight derivatives $\nabla_W^{(l)}$.

Further, an initialization value of the decimal point position of the input neuron and an initialization value of the decimal point position of the output neuron may be selected within the range of [−8, 8]. An initialization value of the decimal point position of the weight may be selected within the range of [−17, 8]. An initialization value of the decimal point position of the input neuron derivative and an initialization value of the decimal point position of the output neuron derivative may be selected within the range of [−40, −20]. An initialization value of the decimal point position of the weight derivative may be selected within the range of [−48, −12].

The method of dynamically adjusting the above-mentioned decimal point position of the data by the above-mentioned computation device will be specifically described as follows.

The method of dynamically adjusting the above-mentioned decimal point position s by the above-mentioned computation device may include adjusting the above-mentioned decimal point position s upwards (that is, value of the decimal point position s becomes larger) and adjusting the above-mentioned decimal point position s downwards (that is, value of the decimal point position s becomes smaller). Specifically, the above-mentioned decimal point position s is adjusted upwardly by a single step according to the maximum absolute value of the first input data. The above-mentioned decimal point position s is adjusted upwardly step by step according to the maximum absolute value of the first input data. The above-mentioned decimal point position s is adjusted upwardly by a single step according to the first input data distribution. The above-mentioned decimal point position s is adjusted upwardly step by step according to the first input data distribution. The above-mentioned decimal point position s is adjusted downwardly according to the absolute value of the first input date.

In case (a), the computation device upwardly adjusts the above-mentioned decimal point position s by a single step according to the maximum absolute value of the first input data.

Assuming that the above-mentioned decimal point position is s_old before being adjusted, the fixed-point data corresponding to the decimal point position s_old may represent data with a range of [neg, pos], where pos = $(2^{bitnum-1}-1)*2s\_old$, neg = $-(2^{bitnum-1}-1)*2^{s\_old}$. If the maximum absolute value $a_{max}$ of the data in the first input data is greater than and equal to pos, the decimal point position adjusted is s_new = $\lceil \log_2 a_{max} - bitnum+1 \rceil$; otherwise, the above-mentioned decimal point position will not be adjusted, that is, s_new = s_old.

In case (b), the computation device upwardly adjusts the above-mentioned decimal point position s step by step according to the maximum absolute value of the first input data.

Assuming that the above-mentioned decimal point position is s_old before being adjusted, the fixed-point data corresponding to the decimal point position s_old may represent data with a range of [neg, pos], where pos = $(2^{bitnum-1}-1)*2s\_old$, neg = $-(2^{bitnum-1}-1)*2^{s\_old}$. If the maximum absolute value $a_{max}$ of the data in the first input data is greater than and equal to pos, the decimal point position adjusted is s_new = s_old+1; otherwise, the above-mentioned decimal point position will not be adjusted, that is s_new = s_old.

In case (c), the computation device upwardly adjusts the above-mentioned decimal point position s by single step according to the first input data distribution.

Assuming that the above-mentioned decimal point position is s_old before being adjusted, the fixed-point data corresponding to the decimal point position s_old may represent data with a range of [neg, pos]; where pos = $(2^{bitnum-1}-1)*2s\_old$, neg = $-(2^{bitnum-1}-1)*2^{s\_old}$. Statistical parameters of the absolute value of first input data are processed, such as a mean value $a_{mean}$ of the absolute value and a standard deviation $a_{std}$ of the absolute value. The maximum range of data is set as $a_{max} = a_{mean} + na_{std}$. If $a_{max} \geq$ pos, s_new = $\lceil \log_2 a_{max} - bitnum+1 \rceil$; otherwise, the above-mentioned decimal point position will not be adjusted, that is s_new = s_old.

Further, the above-mentioned n may be two or three.

In case (d), the computation device upwardly adjusts the above-mentioned decimal point position s step by step according to the first input data distribution.

Assuming that the above-mentioned decimal point position is s_old before being adjusted, the fixed-point data corresponding to the decimal point position s_old may represent data with a range of [neg, pos], where pos = $(2^{bitnum-1}-1)*2^{s\_old}$, neg = $-(2^{bitnum-1}-1)*2^{s\_old}$. The statistical parameters of the absolute value of first input data are processed, such as the mean value $a_{mean}$ of the absolute value and the standard deviation $a_{std}$ of the absolute value. The maximum range of data is set as $a_{max} = a_{mean} + na_{std}$, where n is three. If $a_{max} \geq$ pos, s_new = s_old+1; otherwise, the above-mentioned decimal point position will not be adjusted, that is s_new = s_old.

In case (e), the computation device downwardly adjusts the above-mentioned decimal point position s according to the maximum absolute value of the first input date.

Assuming that the above-mentioned decimal point position is s_old before being adjusted, the fixed-point data corresponding to the decimal point position s_old may represent data with a range of [neg, pos], where pos = $(2^{bitnum-1}-1)*2^{s\_old}$, neg = $-(2^{bitnum-1}-1)*2^{s\_old}$. If the maximum absolute value $a_{max}$ of the first input date is less than $2^{s\_old+(bitnum-n)}$ and s_old ≥ $s_{min}$, s_new = s_old, where the n is an integer constant, and the $s_{min}$ may be an integer or a negative infinity.

Further, the above-mentioned n is three, and the above-mentioned $s_{min}$ is −64.

In an example, an adjusting frequency of the decimal point position may be determined as follows. The decimal point position of the first input data may never be adjusted. Alternatively, the decimal point position of the first input data may be adjusted every n first training cycles (i.e., iteration), where the n is a constant. Alternatively, the decimal point position of the first input data may be adjusted every n second training cycles (i.e., epoch), where the n is a constant. Alternatively, the decimal point position of the first input data may be adjusted every n first training periods or n second training periods, and adjusting the decimal point position of the first input data every n first training periods or second training periods, and then the n may be adjusted, that is, n=αn, where α is greater than one. Alternatively, the decimal point position of the first input data may be adjusted every n first training period or second training period, and the n is gradually decreased as the number of training rounds increases.

Further, the decimal point position of the input neuron, the decimal point position of the weight, and the decimal point position of the output neuron may be adjusted every 100 first training cycles. The decimal point position of the input neuron derivative and the decimal point position of the output neuron derivative may be adjusted every 20 first training cycles.

It should be noted that the first training period is the time required to train a batch of samples, and the second training period is the time required to perform training for all training samples.

It should be noted that the decimal point position of the above data is initialized and adjusted according to the average value or the intermediate value of the absolute value of the above data. Specific details may refer to the above-identified related description of initializing and adjusting the decimal point position of the above data according to the maximum value of the absolute value of the data, which will not be described herein.

It is to be noted that, for the sake of simplicity, the foregoing method examples are described as a series of action combinations, however, it will be appreciated by those skilled in the art that the present disclosure is not limited by the sequence of actions described. According to the present disclosure, certain steps or operations may be performed in other order or simultaneously. Besides, it will be appreciated by those skilled in the art that the examples described in the specification are exemplary examples and the actions and modules involved are not necessarily essential to the present disclosure.

In the foregoing examples, the description of each example has its own emphasis. For the parts not described in detail in one example, reference may be made to related descriptions in other examples.

In the examples of the disclosure, it should be understood that, the apparatus disclosed in examples provided herein may be implemented in other manners. For example, the device/apparatus examples described above are merely illustrative; for instance, the division of the unit is only a logical function division and there may be other manners of division during actual implementations, for example, multiple units or components may be combined or may be integrated into another system, or some features may be ignored, omitted, or not performed. In addition, coupling or communication connection between each illustrated or discussed component may be direct coupling or communication connection, or may be indirect coupling or communication among devices or units via some interfaces, and may be electrical connection, mechanical connection, or other forms of connection.

The units described as separate components may or may not be physically separated, the components illustrated as units may or may not be physical units, that is, they may be in the same place or may be distributed to multiple network elements. All or part of the units may be selected according to actual needs to achieve the purpose of the technical solutions of the examples.

In addition, the functional units in various examples of the present disclosure may be integrated into one processing unit, or each unit may be physically present, or two or more units may be integrated into one unit. The above-mentioned integrated unit may be implemented in the form of hardware or a software function unit.

The integrated unit may be stored in a computer-readable memory if it is implemented in the form of a software functional unit and is sold or used as a separate product. Based on such understanding, the technical solutions of the present disclosure essentially, or the part of the technical solutions that contributes to the related art, or all or part of the technical solutions, may be embodied in the form of a software product which is stored in a memory and may include instructions for causing a computer device (which may be a personal computer, a server, or a network device and so on) to perform all or part of the steps described in the various examples of the present disclosure. The memory may include various medium capable of storing program codes, such as a USB (universal serial bus) flash disk, a read-only memory (ROM), a random access memory (RAM), a removable hard disk, Disk, compact disc (CD), or the like.

It will be understood by those of ordinary skill in the art that all or a part of the various methods of the examples described above may be accomplished by means of a program to instruct associated hardware. The program may be stored in a computer-readable memory, which may include a flash memory, a read-only memory (ROM), a random-access memory (RAM), a disk or a compact disc (CD), and so on.

The examples of the present disclosure are described in detail above, specific examples are used herein to describe the principle and implementation manners of the present disclosure. The description of the above examples is merely used to help understand the method and the core idea of the present disclosure. Meanwhile, those skilled in the art may make modifications to the specific implementation manners and the application scope according to the idea of the present disclosure. In summary, the contents of the specification should not be construed as limiting the present disclosure.

What is claimed is:

1. A computation device, comprising:
 a controller unit, and
 a conversion unit,
 wherein the controller unit is configured to:
  obtain a data conversion instruction and one or more operation instructions, wherein the data conversion instruction comprises an opcode field and an opcode, wherein the opcode is configured to indicate information of a function of the data conversion instruction, and the opcode field comprises information of a decimal point position, a flag bit indicating a data type of a first input data, and an identifier of data type conversion;
  obtain the first input data; and
  transmit the opcode and the opcode field of the data conversion instruction and the first input data to the conversion unit; and
 wherein the conversion unit is configured to convert the first input data into a second input data according to the opcode and the opcode field of the data conversion instruction, wherein the second input data is fixed-point data.

2. The computation device of claim 1, wherein the obtaining the data conversion instruction and one or more operation instructions by the controller unit includes:
   obtaining, by the controller unit, a computation instruction, and parsing, by the controller unit, the computation instruction to obtain the data conversion instruction and the one or more operation instructions.

3. The computation device of claim 2, wherein the computation device is configured to perform a machine learning computation, and further includes an operation unit, wherein:
   the controller unit is further configured to transmit the one or more operation instructions to the operation unit,
   the conversion unit is further configured to transmit the second input data to the operation unit, and
   the operation unit is configured to operate on the second input data according to the one or more operation instructions to obtain a computation result of the computation instruction.

4. The computation device of claim 3, wherein the machine learning computation includes an artificial neural network operation; the first input data includes an input neuron and a weight; and the computation result is an output neuron.

5. The computation device of claim 4, wherein the operation unit includes a primary processing circuit and a plurality of secondary processing circuits, wherein:
   the primary processing circuit is configured to perform pre-processing on the second input data and to transmit data and the one or more operation instructions between the plurality of secondary processing circuits and the primary processing circuit,
   the plurality of secondary processing circuits is configured to perform intermediate operations to obtain a plurality of intermediate results according to the second input data and the one or more operation instructions transmitted from the primary processing circuit, and transmit the plurality of intermediate results to the primary processing circuit, and
   the primary processing circuit is further configured to perform post-processing on the plurality of intermediate results to obtain the computation result of the computation instruction.

6. The computation device of claim 5, further comprising a storage unit and a direct memory access (DMA) unit, wherein:
   the storage unit includes a combination of a register and a cache,
   the cache includes a scratch pad cache and is configured to store the first input data,
   the register is configured to store scalar data in the first input data, and
   the DMA unit is configured to read data from the storage unit or store data into the storage unit.

7. The computation device of claim 5, wherein the controller unit includes an instruction cache unit, an instruction processing unit, and a storage queue unit, wherein:
   the instruction cache unit is configured to store the computation instruction associated with an artificial neural network operation,
   the instruction processing unit is configured to parse the computation instruction to obtain the data conversion instruction and the one or more operation instructions, and to parse the data conversion instruction to obtain the opcode and the opcode field of the data conversion instruction, and
   the storage queue unit is configured to store an instruction queue, the instruction queue including a plurality of operation or computation instructions, wherein the plurality of operation or computation instructions is to be executed in a sequence.

8. The computation device of claim 7, wherein the controller unit further includes:
   a dependency relationship processing unit configured to:
      determine whether there exists an associated relationship between a first operation instruction and a zeroth operation instruction before the first operation instruction,
      cache the first operation instruction in the instruction cache unit based on a determination that there exists an associated relationship between the first operation instruction and the zeroth operation instruction, and
      extract the first operation instruction from the instruction cache unit to the operation unit, when an execution of the zeroth operation instruction is completed,
   wherein determining whether there exists an associated relationship between the first operation instruction and the zeroth operation instruction before the first operation instruction by the dependency relationship processing unit includes:
      extracting a first storage address interval of data required in the first operation instruction according to the first operation instruction,
      extracting a zeroth storage address interval of data required in the zeroth operation instruction according to the zeroth operation instruction,
      determining that there exists an associated relationship between the first operation instruction and the zeroth operation instruction, when an overlapped region exists between the first storage address interval and the zeroth storage address interval, and
      determining that there does not exist an associated relationship between the first operation instruction and the zeroth operation instruction, when no overlapped region exists between the first storage address interval and the zeroth storage address interval.

9. The computation device of claim 5, wherein the operation unit includes a tree module, wherein:
   the tree module includes a root port coupled with the primary processing circuit and a plurality of branch ports coupled with the plurality of secondary processing circuits, and
   the tree module is configured to forward data and the one or more operation instructions transmitted among the primary processing circuit and the plurality of secondary processing circuits, and
   the tree module is an n-tree structure, the n being an integer greater than or equal to two.

10. The computation device of claim 9, wherein the primary processing circuit includes a combination of an activation processing circuit and an addition processing circuit, wherein:
   the activation processing circuit is configured to perform an activation operation on data in the primary processing circuit, and
   the addition processing circuit is configured to perform an addition operation or an accumulation operation, and
   the plurality of secondary processing circuits includes:

multiplication processing circuits configured to perform a multiplication operation on data blocks received to obtain product results, and
an accumulation processing circuits configured to perform an accumulation operation on the product results to obtain the plurality of intermediate results.

11. The computation device of claim 5, wherein the operation unit further includes a branch processing circuit, wherein:
the primary processing circuit is configured to determine that the input neuron is broadcast data and the weight is distribution data, divide the distribution data into a plurality of data blocks, and transmit at least one of the plurality of data blocks, the broadcast data, and at least one of the one or more operation instructions to the branch processing circuit,
the branch processing circuit is configured to forward the data blocks, the broadcast data, and the at least one of the one or more operation instructions transmitted among the primary processing circuit and the plurality of secondary processing circuits,
the plurality of secondary processing circuits is configured to perform operations on the data blocks received and the broadcast data received according to the plurality of one or more operation instructions to obtain the plurality of intermediate results, and to transmit the plurality of intermediate results to the branch processing circuit, and
the primary processing circuit is further configured to perform post-processing on the plurality of intermediate results received from the branch processing circuit to obtain the computation result of the computation instruction, and to send the computation result of the computation instruction to the controller unit.

12. The computation device of claim 5, wherein the plurality of secondary processing circuits is distributed in an array, wherein:
each of the plurality of secondary processing circuit is coupled with adjacent other secondary processing circuits, and the primary processing circuit is coupled with K secondary processing circuits of the plurality of secondary processing circuits,
the K secondary processing circuits include n secondary processing circuits in a first row, n secondary processing circuits in a $m^{th}$ row, and m secondary processing circuits in a first column, and the K secondary processing circuits are configured to forward data and instructions transmitted among the primary processing circuit and the plurality of secondary processing circuits,
the primary processing circuit is further configured to determine that the input neuron is broadcast data, the weight is distribution data, divide the distribution data into a plurality of data blocks, and transmit at least one of the plurality of data blocks and at least one of the one or more operation instructions to the K secondary processing circuits,
the K secondary processing circuits are configured to convert the data transmitted among the primary processing circuit and the plurality of secondary processing circuits,
the plurality of secondary processing circuits is configured to perform operations on the plurality of data blocks received according to the one or more operation instructions to obtain the plurality of intermediate results, and to transmit the plurality of intermediate results to the K secondary processing circuits, and the primary processing circuit is configured to process the plurality of intermediate results received from the K secondary processing circuits to obtain the computation result of the computation instruction, and to send the computation result of the computation instruction to the controller unit.

13. The computation device of claim 12, wherein:
the primary processing circuit is configured to perform a combined ranking processing on the plurality of intermediate results received from the plurality of secondary processing circuits to obtain the computation result of the computation instruction, or
the primary processing circuit is configured to perform a combined ranking processing and an activation processing on the plurality of intermediate results received from the plurality of secondary processing circuits to obtain the computation result of the computation instruction.

14. The computation device of claim 3, wherein when the first input data is fixed-point data, the operation unit further includes:
a derivation unit configured to derive a decimal point position of one or more intermediate results according to a decimal point position of the first input data, wherein the one or more intermediate results are obtained according to the first input data.

15. The computation device of claim 14, wherein the operation unit further includes:
a data cache unit configured to cache one or more intermediate results.

16. A machine learning operation device, comprising one or more computation devices each according to claim 3, wherein the one or more computation devices are configured to obtain data to be processed and control information from other processing devices, to perform a specified machine learning computation, and to transmit an execution result to the other processing devices through I/O interfaces, wherein:
when the machine learning operation device includes a plurality of the computation devices, the plurality of computation devices is configured to couple and transmit data with each other through a specific structure, and
the plurality of computation devices is configured to:
interconnect and to transmit data through a fast external device interconnection PCIE (peripheral component interface express) bus to support larger-scale machine learning computations,
share the same one control system or have respective control systems,
share the same one memory or have respective memories, and
deploy an interconnection manner of any arbitrary interconnection topology.

17. A combination processing device, comprising the machine learning operation device of claim 16, universal interconnection interfaces, a storage device, and other processing devices, wherein:
the machine learning operation device is configured to interact with the other processing devices to jointly perform user-specified computing operations, and
the storage device is configured to couple with the machine learning operation device and the other processing devices respectively for storing data of the machine learning operation device and the other processing devices.

18. A neural network chip, comprising the machine learning operation device of claim 16.

19. An electronic device, comprising the neural network chip of claim 18.

20. A board, comprising a storage device, an interface device, a control device, and the neural network chip of claim 18, wherein:
- the neural network chip is respectively coupled with the storage device, the control device, and the interface device,
- the storage device is configured to store data,
- the interface device is configured to implement data transmission between the neural network chip and external devices,
- the control device is configured to monitor a status of the neural network chip,
- wherein the storage device includes a plurality of groups of storage units, each group of the plurality of groups of storage units being coupled with the neural network chip through a bus, and each storage unit being a double data rate (DDR) synchronous dynamic random access memory (SDRAM),
- the neural network chip includes a DDR controller for controlling data transmission and data storage of each storage unit, and
- the interface device is a standard PCIE interface.

21. A method for performing a machine learning computation, comprising:
- obtaining, by a controller unit, a data conversion instruction and a plurality of operation instructions, wherein the data conversion instruction comprises an opcode field and an opcode, wherein the opcode is configured to indicate information of a function of the data conversion instruction, the opcode field comprises information of a decimal point position, a flag bit indicating a data type of a first input data, and a data type conversion, and
- converting, by a conversion unit, the first input data into second input data according to the data conversion instruction, the second input data being fixed-point data.

22. The method of claim 21, wherein the controller unit is configured to obtain the data conversion instruction and the plurality of operation instructions, wherein obtaining the data conversion instruction and the plurality of operation instructions includes:
- obtaining a computation instruction and parsing the computation instruction to obtain the data conversion instruction and the plurality of operation instructions.

23. The method of claim 22, wherein the method is configured to perform a machine learning computation, and further includes:
- operating on the second input data according to the plurality of operation instructions to obtain a result of the computation instruction.

24. The method of claim 23, wherein:
- the machine learning computation includes an artificial neural network operation,
- the first input data includes an input neuron and a weight, and
- the result is an output neuron.

25. The method of claim 23, wherein converting the first input data into the second input data according to the data conversion instruction by the conversion unit includes:
- parsing the computation instruction to obtain information of the decimal point position, wherein the flag bit indicates the data type of the first input data, and the data type conversion,
- determining the data type of the first input data according to the flag bit indicating the data type of the first input data, and
- converting the first input data into the second input data according to the decimal point position and the data type conversion, the data type of the first input data being inconsistent with a data type of the second input data.

26. The method of claim 23, wherein:
- when the first input data and the second input data are both fixed-point data, the decimal point position of the first input data is inconsistent with a decimal point position of the second input data.

27. The method of claim 26, wherein when the first input data is fixed-point data, the method further includes:
- deriving a decimal point position of at least one intermediate result according to the decimal point position of the first input data, wherein the at least one intermediate result is obtained by operating according to the first input data.

* * * * *